US011887902B2

(12) United States Patent
Kaneko

(10) Patent No.: US 11,887,902 B2
(45) Date of Patent: Jan. 30, 2024

(54) SEMICONDUCTOR DEVICE

(71) Applicant: FUJI ELECTRIC CO., LTD., Kawasaki (JP)

(72) Inventor: Satoshi Kaneko, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 191 days.

(21) Appl. No.: 17/586,328

(22) Filed: Jan. 27, 2022

(65) Prior Publication Data
US 2022/0301955 A1 Sep. 22, 2022

(30) Foreign Application Priority Data

Mar. 19, 2021 (JP) .................................. 2021-045452

(51) Int. Cl.
*H01L 23/373* (2006.01)
*H01L 23/049* (2006.01)
(Continued)

(52) U.S. Cl.
CPC ........ *H01L 23/049* (2013.01); *H01L 23/3735* (2013.01); *H01L 24/48* (2013.01);
(Continued)

(58) Field of Classification Search
CPC ... H01L 23/049; H01L 23/3735; H01L 24/48; H01L 25/072; H01L 25/18; H01L 2224/48139; H01L 2924/10253; H01L 2924/10272; H01L 2924/12032; H01L 2924/12036; H01L 2924/13055; H01L 2924/13091; H01L 2924/3512; H01L 2924/35121; H01L 23/053; H01L 23/24; H01L 23/49811; H01L 24/06; H01L 24/29; H01L 24/32; H01L 24/83; H01L 2224/29101; H01L 2224/73265; H01L 2224/83801; H01L 24/49; H01L 24/45; H01L 2224/04042; H01L 2224/0603; H01L 2224/32225; H01L 2224/45015; H01L 2224/45124; H01L 2224/45147;
(Continued)

(56) References Cited

U.S. PATENT DOCUMENTS 5,471,089 A 11/1995 Nagatomo et al.

FOREIGN PATENT DOCUMENTS

EP 0578108 A1 1/1994
JP H06-21323 A 1/1994
(Continued)

*Primary Examiner* — Elias Ullah
(74) *Attorney, Agent, or Firm* — Rabin & Berdo, P.C.

(57) ABSTRACT

A first wiring member bends at a first bent portion in the shape of the letter "L" in a side view and includes a first horizontal portion parallel to the principal surface of a semiconductor chip and a first vertical portion perpendicular to the first horizontal portion. A second wiring member bends at a second bent portion in a direction opposite to the first wiring member in the shape of the letter "L" in the side view and includes a second horizontal portion flush with the first horizontal portion and a second vertical portion a determined distance distant from the first vertical portion and parallel to the first vertical portion. A wiring holding portion fills a gap between the first and second vertical portions and a gap between the first and second bent portions. Therefore, stress applied to the vicinity of the first or second bent portion is relaxed.

18 Claims, 14 Drawing Sheets

(51) Int. Cl.
  *H01L 23/00*  (2006.01)
  *H01L 25/18*  (2023.01)
  *H01L 25/07*  (2006.01)

(52) U.S. Cl.
  CPC ............ *H01L 25/072* (2013.01); *H01L 25/18* (2013.01); *H01L 2224/48139* (2013.01); *H01L 2924/10253* (2013.01); *H01L 2924/10272* (2013.01); *H01L 2924/12032* (2013.01); *H01L 2924/12036* (2013.01); *H01L 2924/13055* (2013.01); *H01L 2924/13091* (2013.01); *H01L 2924/3512* (2013.01); *H01L 2924/35121* (2013.01)

(58) Field of Classification Search
  CPC . H01L 2224/48091; H01L 2224/48227; H01L 2224/4846; H01L 2224/49113; H01L 2924/181; H01L 2924/19107; H01L 23/49548; H01L 23/49555; H01L 23/49562; H01L 23/49844; H01L 23/49861
  See application file for complete search history.

(56) References Cited

FOREIGN PATENT DOCUMENTS

| | | |
|---|---|---|
| JP | 2004-214452 A | 7/2004 |
| JP | 2006-210500 A | 8/2006 |
| JP | 2015-119121 A | 6/2015 |
| JP | 2019-009328 A | 1/2019 |
| WO | 2021/029150 A1 | 2/2021 |

SEMICONDUCTOR DEVICE

CROSS-REFERENCE TO RELATED APPLICATION

This application is based upon and claims the benefit of priority of the prior Japanese Patent Application No. 2021-045452, filed on Mar. 19, 2021, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices and are used as, for example, power converters which make up inverters. The power devices are insulated gate bipolar transistors (IGBTs), power metal oxide semiconductor field effect transistors (MOSFETs), or the like. Such a semiconductor device includes semiconductor chips including power devices and a plurality of insulated circuit boards. Furthermore, such a semiconductor device includes a plurality of lead frames electrically connected to the semiconductor chips. As the frequency of a power converter becomes higher, there is a demand for a reduction in inductance generated by the plurality of lead frames. In order to reduce inductance, the following proposal, for example, is made. A first power supply potential output electrode (lead frame), a load electrode, and a second power supply potential output electrode (lead frame), which are internal electrodes, are formed so as to have the shape of a plate and are disposed adjacently to one another with an insulator therebetween.

Japanese Laid-open Patent Publication No. 2004-214452

With the above semiconductor device a high voltage is applied between lead frames. As a result, there is need to insulate one lead frame from the other with an insulator. Furthermore, one end of each lead frame may be exposed. In this case, in order to prevent entrance of moisture into the inside of the semiconductor device, there is need for the insulator to adhere closely to the lead frames. However, if the insulator is resin and the lead frames are disposed adjacently to each other, then damage, such as a crack or peeling, to the resin may occur. If damage occurs to the resin used for insulating one lead frame from the other, then it may be that insulation between the lead frames is not maintained. This may lead to deterioration in the reliability of the semiconductor device.

SUMMARY OF THE INVENTION

According to an aspect, there is provided a semiconductor device, including: a first semiconductor chip and a second semiconductor chip; and a wiring unit including a first wiring member having a first one end portion electrically connected to the first semiconductor chip, a second wiring member having a second one end portion electrically connected to the second semiconductor chip, and a wiring holding portion holding a part of the first wiring member and a part of the second wiring member, wherein: the first wiring member includes a first horizontal portion parallel to a principal surface of the first semiconductor chip, a first vertical portion perpendicular to the first horizontal portion, and a first bent portion bent to connect the first horizontal portion and the first vertical portion; the second wiring member includes a second horizontal portion, a surface of which is flush with a surface of the first horizontal portion, a second vertical portion disposed at a determined distance from the first vertical portion to form a first gap, and having a surface parallel to a surface of the first vertical portion, and a second bent portion bent in a direction opposite to the first bent portion to connect the second horizontal portion and the second vertical portion, the second bent portion disposed at a determined distance from the first bent portion to form a second gap; and the wiring holding portion is configured to fill the first gap between the first vertical portion and the second vertical portion and the second gap between the first bent portion and the second bent portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described by reference to the accompanying drawings. In the following description a "front surface" or an "upper surface" indicates an X-Y plane of a semiconductor device 10 of FIG. 1 which faces the upper side (+Z direction). Similarly, an "upside" indicates the upward direction (+Z direction) of the semiconductor device of FIG. 1. A "back surface" or a "lower surface" indicates the X-Y plane of the semiconductor device 10 of FIG. 1 which faces the lower side (−Z direction). Similarly, a "downside" indicates the downward direction (−Z direction) of the semiconductor device 10 of FIG. 1. These terms mean the same directions as needed in the other drawings. The "front surface," the "upper surface," the "upside," the "back surface," the "lower surface," the "downside," and a "side" are simply used as expedient representation for specifying relative positional relationships and do not limit the technical idea of the present disclosure. For example, the "upside" or the "downside" does not always mean the vertical direction relative to the ground. That is to say, a direction indicated by the "upside" or the "downside" is not limited to the gravity direction. Furthermore, in the following description a "main ingredient" indicates an ingredient contained at a rate of 80 volume percent (vol %) or more.

First Embodiment

Figure 1:
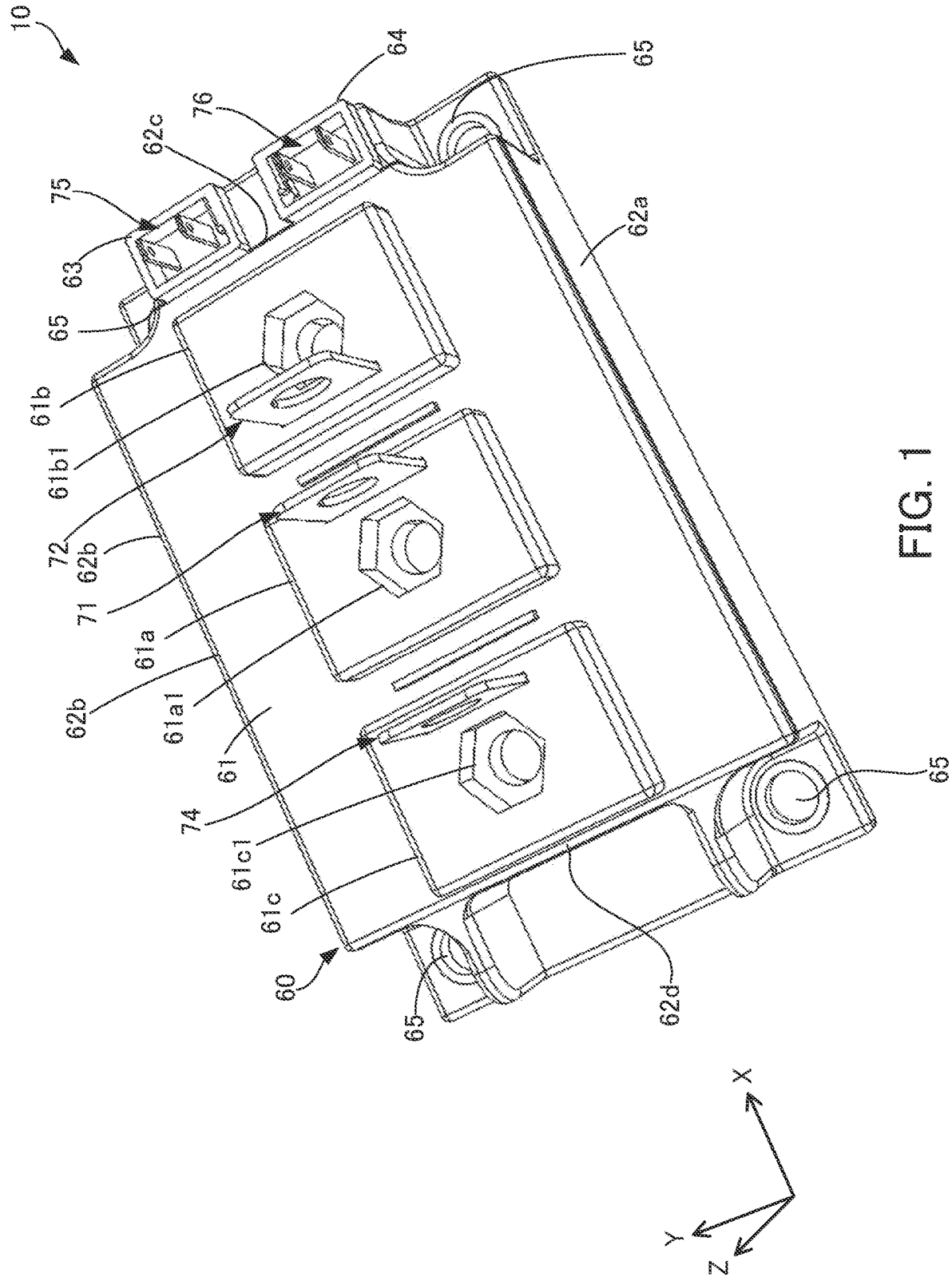
FIG. 1 is an external view of a semiconductor device according to a first embodiment.

The external appearance of a semiconductor device according to a first embodiment will be described with reference to FIG. 1. FIG. 1 is an external view of a semiconductor device according to a first embodiment. As illustrated in FIG. 1, components of a semiconductor device 10 described later are covered with a case 60. A radiation plate 30 which is rectangular in a plan view is formed on the back surface of the semiconductor device 10 (on the back side of the case 60) (see FIG. 3).

The case 60 includes a lid portion 61, side wall portions 62*a* through 62*d*, and terminal openings 63 and 64. Furthermore, terminal blocks 61*a*, 61*b*, and 61*c* are formed in a central portion of the lid portion 61 in the longitudinal direction. Screw holes 61*a*1, 61*b*1, and 61*c*1 are made in the front surfaces of the terminal blocks 61*a*, 61*b*, and 61*c*, respectively. First, second, and third wiring members 71, 72, and 74 extend upward from the terminal blocks 61*a*, 61*b*, and 61*c*, respectively. FIG. 1 illustrates a case where the first, second, and third wiring members 71, 72, and 74 extend upward. The first, second, and third wiring members 71, 72, and 74 which extend are bent to the side of the front surfaces of the terminal blocks 61*a*, 61*b*, and 61*c*, respectively. Opening holes made in the first, second, and third wiring members 71, 72, and 74 correspond to the screw holes 61*a*1, 61*b*1, and 61*c*1, respectively, and the first, second, and third wiring members 71, 72, and 74 are screwed into the screw holes 61*a*1, 61*b*1, and 61*c*1, respectively, via the opening holes.

The side wall portions 62*a* through 62*d* surround the radiation plate 30 on all sides. That is to say, the side wall portions 62*a* through 62*d* surround the components disposed over the radiation plate 30 (see FIG. 2). The side wall portions 62*a* through 62*d* are stuck to the radiation plate 30 with an adhesive. The terminal openings 63 and 64 are formed in the side wall portion 62*c*. Control terminals 75 and 76 are exposed from the terminal openings 63 and 64, respectively. Fixing holes 65 are made near the corner portions of an area surrounded by the side wall portions 62*a* through 62*d*. When the semiconductor device 10 is fixed to a desired position, the semiconductor device 10 is screwed via the fixing holes 65.

The side wall portions 62*a* through 62*d*, the terminal openings 63 and 64, and the fixing holes 65 included in the case 60 are integrally molded by the use of resin. The lid portion 61 is also molded integrally with the side wall portions 62*a* through 62*d*, the terminal openings 63 and 64, and the fixing holes 65 by the use of resin. Such resin contains a thermoplastic resin as a main ingredient. A thermoplastic resin is polyphenylene sulfide resin, polybutylene terephthalate resin, polybutylene succinate resin, polyamide resin, acrylonitrile butadiene styrene resin, or the like. The lid portion 61 separately formed may be fixed on an opening of the side wall portions 62*a* through 62*d* of the case 60 with an adhesive.

Figure 2:
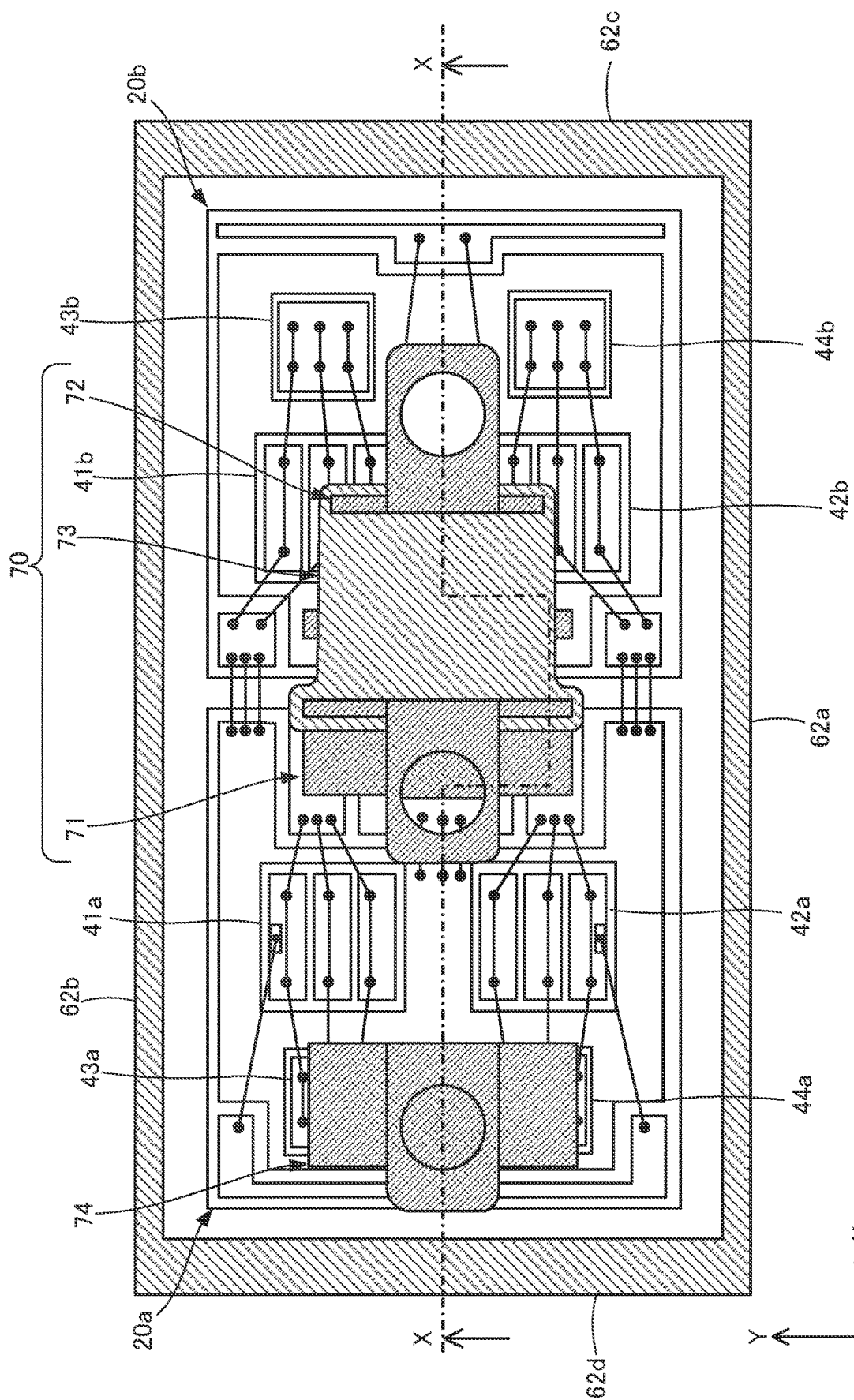
FIG. 2 is a plan view of the semiconductor device according to the first embodiment.
Figure 3:
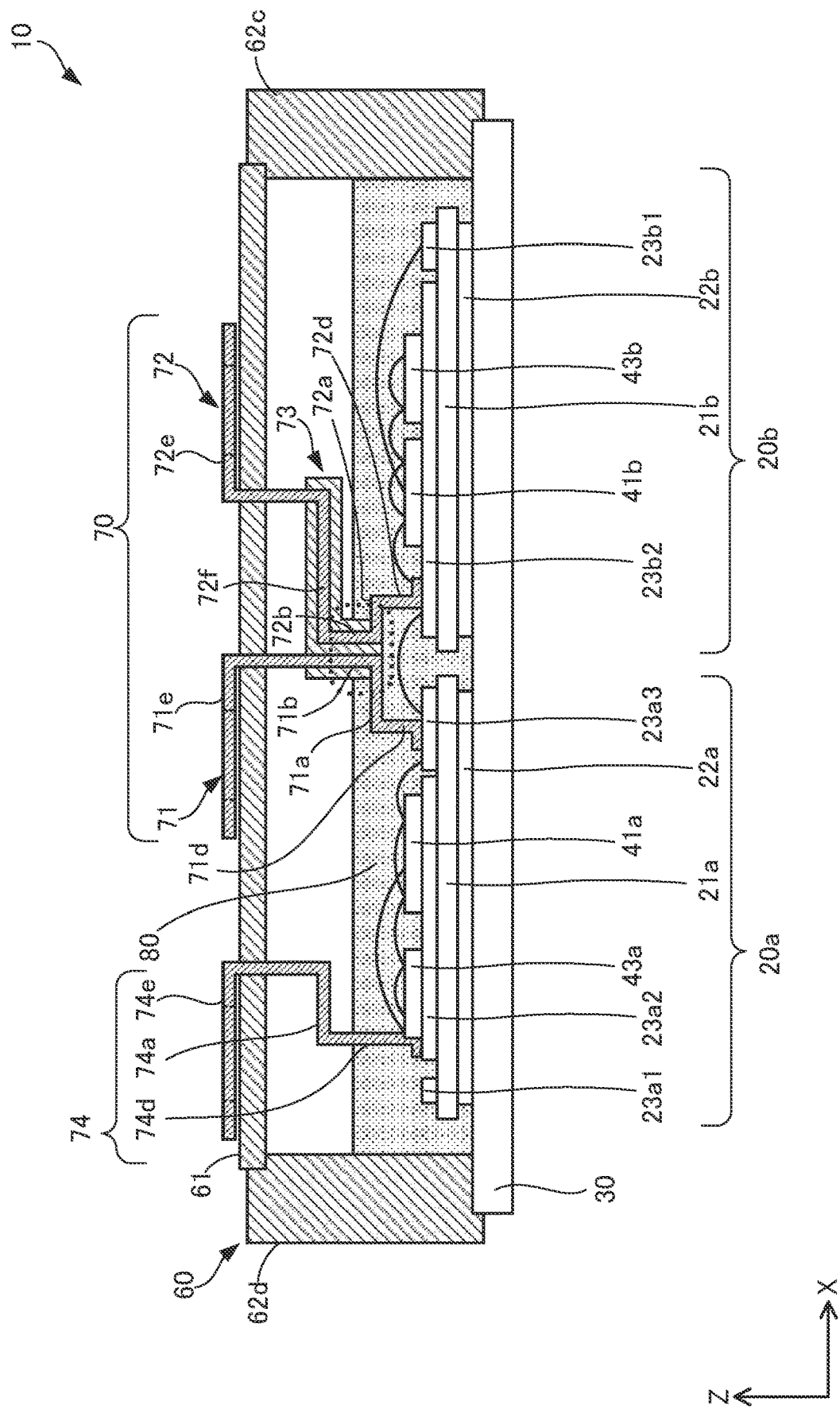
FIG. 3 is a sectional side elevation view of the semiconductor device according to the first embodiment.
Figure 4:
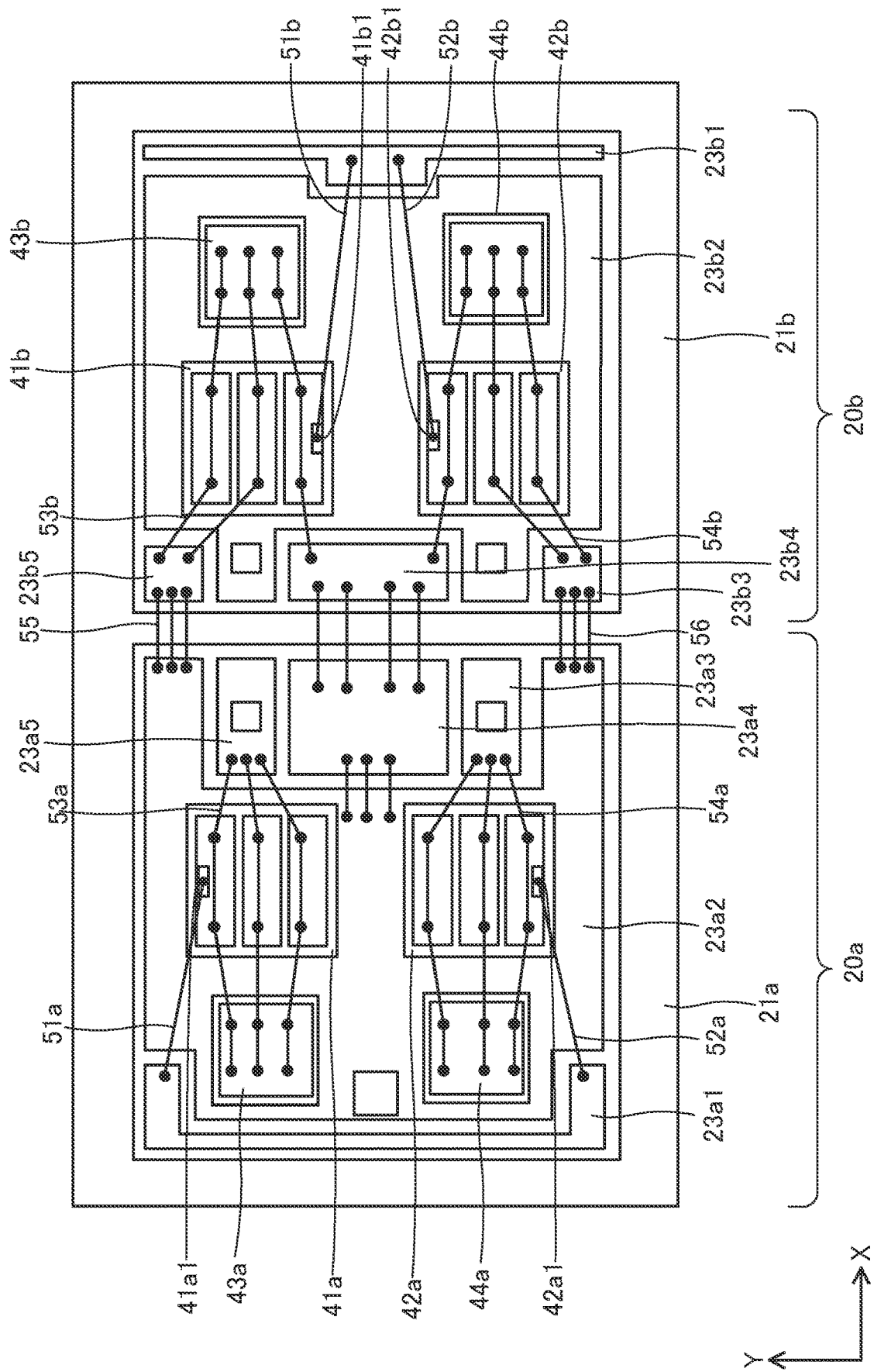
FIG. 4 is a plan view of insulated circuit boards included in the semiconductor device according to the first embodiment.
Figure 5:
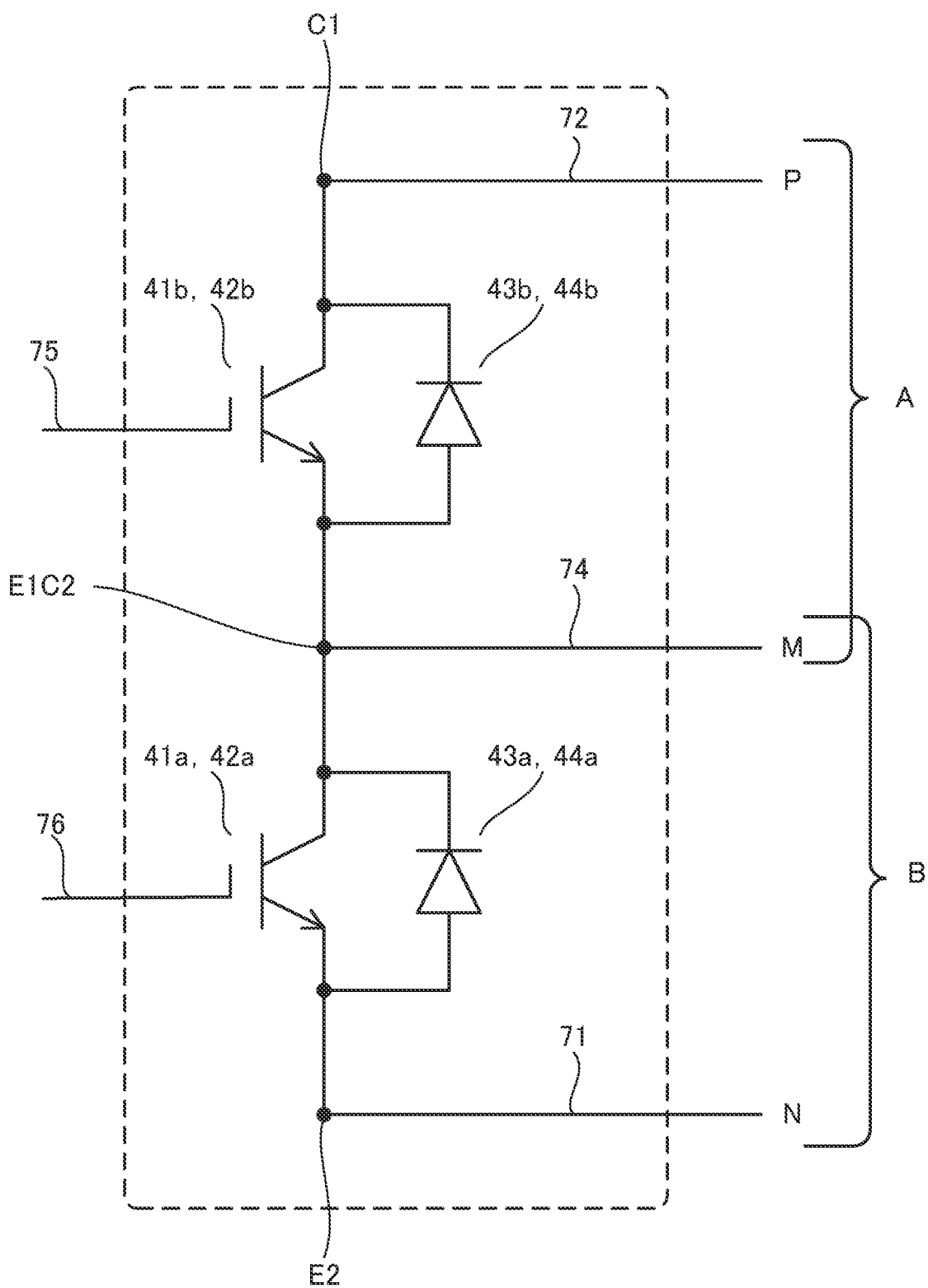
FIG. 5 illustrates an equivalent circuit of the semiconductor device according to the first embodiment.
Figure 6:
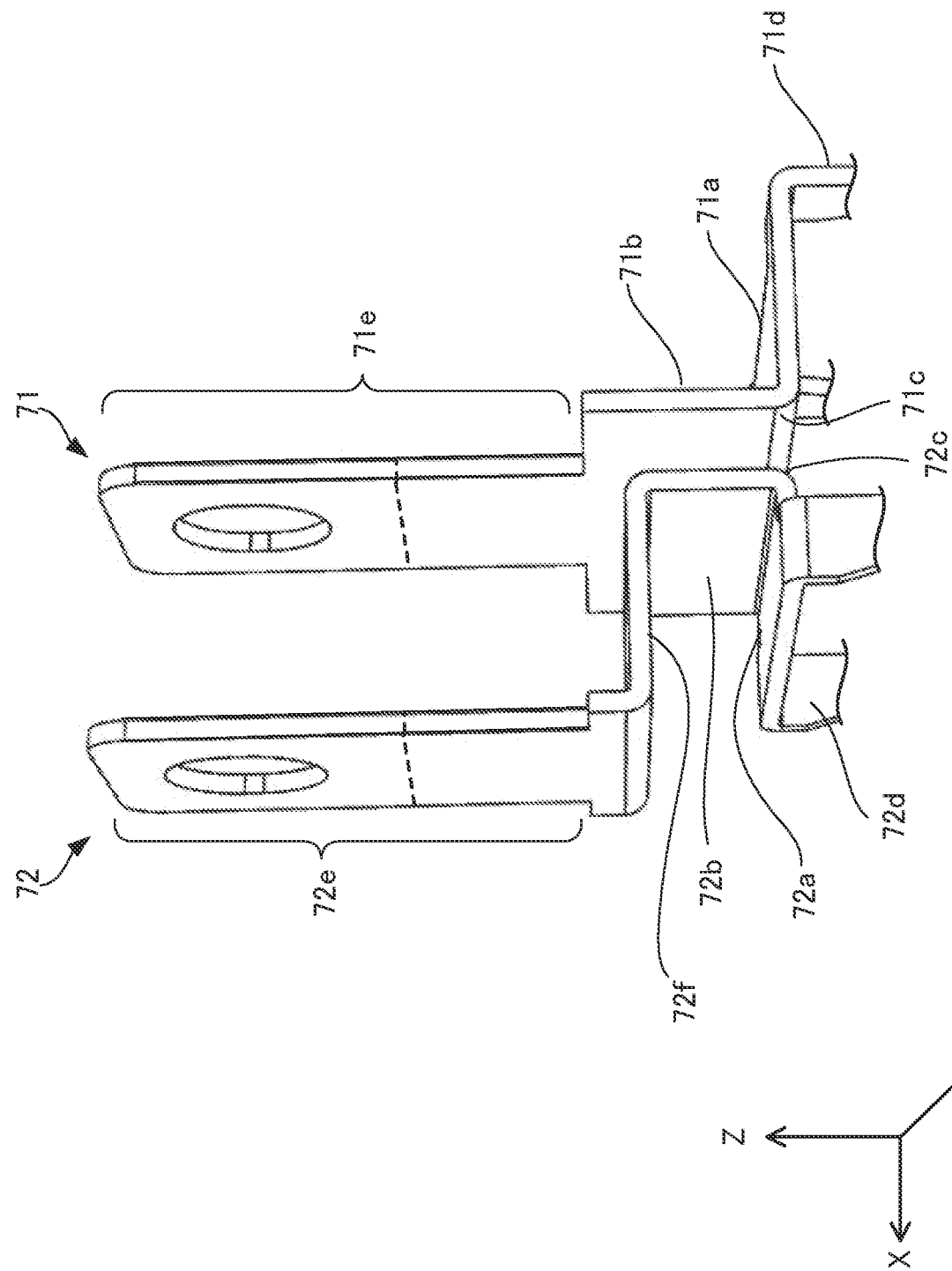
FIG. 6 illustrates wiring members of a wiring unit included in the semiconductor device according to the first embodiment (part 1)
Figure 7B:
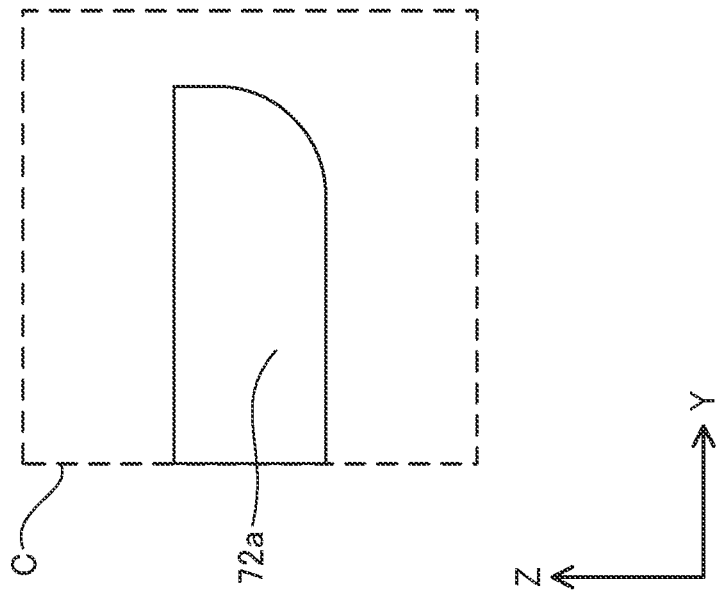
FIGS. 7A and 7B illustrate wiring members of a wiring unit included in the semiconductor device according to the first embodiment (part 2)
Figure 7A:
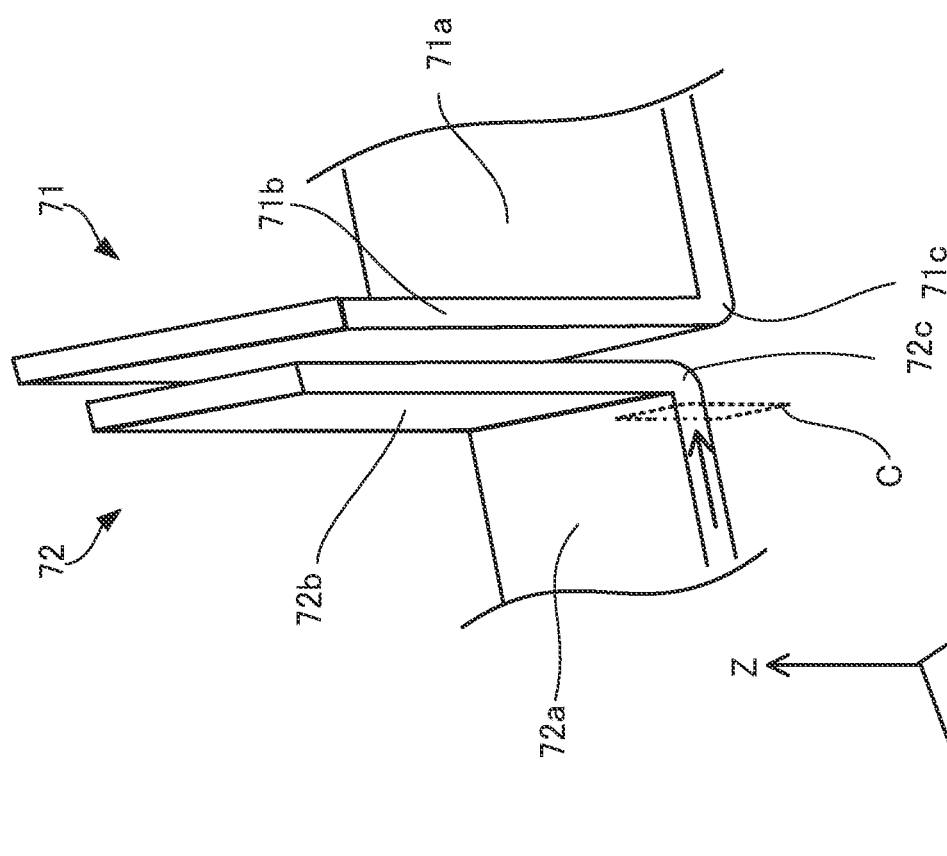
Figure 8:
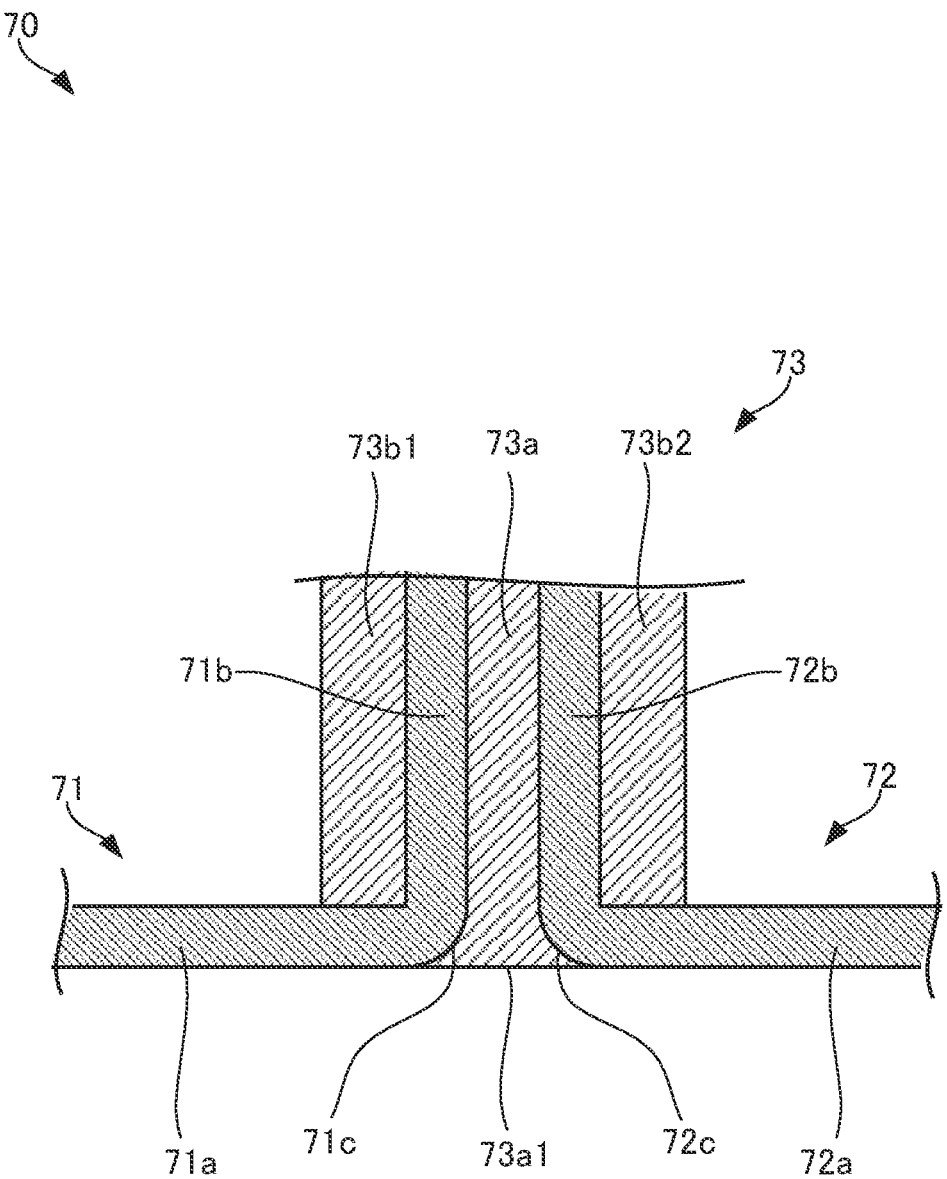
FIG. 8 is a fragmentary sectional view of the wiring unit included in the semiconductor device according to the first embodiment.

The components housed in the semiconductor device 10 will now be described with reference to FIGS. 2 through 8. FIG. 2 is a plan view of the semiconductor device according to the first embodiment. FIG. 3 is a sectional side elevation view of the semiconductor device according to the first embodiment. FIG. 4 is a plan view of insulated circuit boards included in the semiconductor device according to the first embodiment. FIG. 5 illustrates an equivalent circuit of the semiconductor device according to the first embodiment. FIG. 6 and FIGS. 7A and 7B illustrate wiring members of a wiring unit included in the semiconductor device according to the first embodiment. FIG. 8 is a fragmentary sectional view of the wiring unit included in the semiconductor device according to the first embodiment. In FIG. 2, the lid portion 61 is removed from the case 60 of the semiconductor device 10 and a sealing member 80 is not illustrated. Furthermore, in FIGS. 2 and 3, the control terminals 75 and 76, the terminal openings 63 and 64, or the fixing holes 65 are not illustrated. In FIGS. 2 and 3, the first wiring member 71, second wiring member 72, and third wiring member 74 are bent. FIG. 3 is a sectional view taken along the dot-dash line X-X of FIG. 2. Furthermore, in FIG. 3, for example, the terminal blocks 61*a*, 61*b*, and 61*c* of the lid portion 61 are omitted for simplification. In FIG. 6, part of a first leg portion 71*d* of the first wiring member 71 and part of a second leg portion 72*d* of the second wiring member 72 are omitted. FIG. 7A is a perspective view of a first vertical portion 71*b* and a first horizontal portion 71*a* of the first wiring member 71 and a second vertical portion 72*b* and a second horizontal portion 72*a* of the second wiring member 72. FIG. 7B is a sectional view obtained when a section C in FIG. 7A is viewed from an arrow direction.

As illustrated in FIGS. 2 through 4, the semiconductor device 10 includes insulated circuit boards 20*a* and 20*b* and the radiation plate 30 over whose front surface the insulated circuit boards 20*a* and 20*b* are arranged. Semiconductor chips 41*a* through 44*a* and semiconductor chips 41*b* through 44*b* are arranged over the insulated circuit boards 20*a* and 20*b*, respectively. Furthermore, the semiconductor device 10 includes the first wiring member 71, second wiring member 72, and third wiring member 74. For example, each of the first, second, and third wiring members 71, 72, and 74 is a plate-shaped lead frame.

The case 60 is arranged over a peripheral edge portion of the radiation plate 30 and includes the side wall portions 62*a* through 62*d* which surround the insulated circuit boards 20*a* and 20*b* and the lid portion 61 arranged over the opening of the side wall portions 62*a* through 62*d*. Furthermore, the semiconductor chips 41*a* through 44*a* and 41*b* through 44*b* and the insulated circuit boards 20*a* and 20*b* (and bonding wires 51*a* through 54*a*, 51*b* through 54*b*, 55, and 56) are housed in an area surrounded by the case 60 and the radiation plate 30. In addition, the semiconductor chips 41*a* through 44*a* and 41*b* through 44*b* and the insulated circuit boards 20*a* and 20*b* (and the bonding wires 51*a* through 54*a*, 51*b* through 54*b*, 55, and 56) are sealed with the sealing member 80. Moreover, the first, second, and third wiring members 71, 72, and 74 are fixed to the lid portion 61 for electrically connecting them to external devices. The control terminal 75 or 76 is not illustrated.

One end portion of each of the first, second, and third wiring members 71, 72, and 74 is connected to the insulated circuit board 20a or 20b inside the case 60. Furthermore, the other end portion of each of the first, second, and third wiring members 71, 72, and 74 extends from the case 60 to the outside. The other end portion of each of the first, second, and third wiring members 71, 72, and 74 may be connected to an external device (not illustrated). Specifically, one end portion of the first wiring member 71 is connected electrically and mechanically to conductive patterns 23a3 and 23a5 of the insulated circuit board 20a. In addition, the one end portion of the first wiring member 71 is electrically connected to the semiconductor chips 41a, 42a, 43a, and 44a via the conductive patterns 23a3 and 23a5 and the bonding wires 53a and 54a. Moreover, a first external connection portion 71e, which is the other end portion of the first wiring member 71, extends from the lid portion 61 to the outside of the case 60 and is exposed along the front surface of the lid portion 61. The one end portion of the second wiring member 72 is connected electrically and mechanically to a conductive pattern 23b2 of the insulated circuit board 20b. Furthermore, the one end portion of the second wiring member 72 is electrically connected to the semiconductor chips 41b, 42b, 43b, and 44b via the conductive pattern 23b2. In addition, a second external connection portion 72e, which is the other end portion of the second wiring member 72, extends from the lid portion 61 to the outside of the case 60 and is exposed along the front surface of the lid portion 61. The one end portion of the third wiring member 74 is connected electrically and mechanically to a conductive pattern 23a2 of the insulated circuit board 20a. In addition, the one end portion of the third wiring member 74 is electrically connected to the semiconductor chips 41a, 42a, 43a, and 44a via the conductive pattern 23a2. Moreover, a third external connection portion 74e, which is the other end portion of the third wiring member 74, extends from the lid portion 61 to the outside of the case 60 and is exposed along the front surface of the lid portion 61.

Furthermore, a wiring unit 70 includes the first and second wiring members 71 and 72 and a wiring holding portion 73. With the wiring unit 70 part of the first wiring member 71 and part of the second wiring member 72 are integrally molded with the wiring holding portion 73. In addition, at this time insulation between the first and second wiring members 71 and 72 is kept by the wiring holding portion 73. The details of the wiring unit 70 will be described later.

The insulated circuit board 20a includes an insulating board 21a, a metal plate 22a formed on the back surface of the insulating board 21a, and conductive patterns 23a1 through 23a5 formed over the front surface of the insulating board 21a. The insulated circuit board 20b includes an insulating board 21b, a metal plate 22b formed on the back surface of the insulating board 21b, and conductive patterns 23b1 through 23b5 formed over the front surface of the insulating board 21b. The insulating board 21a and 21b and the metal plates 22a and 22b are rectangular in a plan view. Furthermore, corner portions of each of the insulating board 21a and 21b and the metal plates 22a and 22b may be R-chamfered or C-chamfered. The size of the metal plates 22a and 22b is smaller than that of the insulating board 21a and 21b in a plan view and the metal plates 22a and 22b are formed inside the insulating board 21a and 21b, respectively.

Each of the insulating board 21a and 21b contains as a main ingredient a ceramic having high thermal conductivity. Such a ceramic is made of a material containing aluminum oxide, aluminum nitride, silicon nitride, or the like as a main ingredient. Furthermore, the thickness of the insulating board 21a and 21b is greater than or equal to 0.2 mm and smaller than or equal to 2.5 mm.

Each of the metal plates 22a and 22b contains as a main ingredient metal, such as copper, aluminum, or an alloy containing at least one of them, having high thermal conductivity. Furthermore, the thickness of the metal plates 22a and 22b is greater than or equal to 0.1 mm and smaller than or equal to 5.0 mm. In order to improve corrosion resistance, plating treatment may be performed on the surfaces of the metal plates 22a and 22b. At this time nickel, a nickel-phosphorus alloy, a nickel-boron alloy or the like is used as a plating material.

Each of the conductive patterns 23a1 through 23a5 and 23b1 through 23b5 contains as a main ingredient metal, such as copper, aluminum, or an alloy containing at least one of them, having good electrical conductivity. Furthermore, the thickness of the conductive patterns 23a1 through 23a5 and 23b1 through 23b5 is greater than or equal to 0.1 mm and smaller than or equal to 5.0 mm. In order to improve corrosion resistance, plating treatment may be performed on the surfaces of the conductive patterns 23a1 through 23a5 and 23b1 through 23b5. At this time, nickel, a nickel-phosphorus alloy, a nickel-boron alloy or the like is used as a plating material. The conductive patterns 23a1 through 23a5 and 23b1 through 23b5 are obtained by forming a metal layer over the front surfaces of the insulating board 21a and 21b and performing treatment, such as etching, on the metal layer. Alternatively, the conductive patterns 23a1 through 23a5 and 23b1 through 23b5 cut in advance from a metal layer may be pressure-bonded to the front surfaces of the insulating board 21a and 21b, respectively. The shape or the number of the conductive patterns 23a1 through 23a5 and 23b1 through 23b5 illustrated in FIGS. 2 through 4 is an example.

A direct copper bonding (DCB) substrate, an active metal brazed (AMB) substrate, or the like may be used as the insulated circuit boards 20a and 20b each having the above structure. The insulated circuit boards 20a and 20b conduct heat generated by the semiconductor chips 41a through 44a and 41b through 44b to the outside via the conductive patterns 23a2 and 23b2, the insulating boards 21a and 21b, and the metal plates 22a and 22b, respectively.

Furthermore, the one end portion (first leg portion 71d (see FIG. 3)) of the first wiring member 71 is connected to the conductive patterns 23a3 and 23a5 of the above insulated circuit board 20a with solder (not illustrated) therebetween. The one end portion (second leg portion 72d (see FIG. 3)) of the second wiring member 72 is connected to the conductive pattern 23b2 of the insulated circuit board 20b with solder (not illustrated) therebetween. The one end portion (third leg portion 74d (see FIG. 3)) of the third wiring member 74 is connected to the conductive pattern 23a2 of the insulated circuit board 20a with solder (not illustrated) therebetween. Squares on the conductive patterns 23a2, 23a3 and 23a5, and 23b2 indicate areas to which the third wiring member 74, the first wiring member 71, and the second wiring member 72, respectively, are bonded.

Each of the semiconductor chips 41a through 44a and 41b through 44b contains silicon or silicon carbide as a main ingredient. Each of the semiconductor chips 41a, 42a, 41b, and 42b is a switching element such as an IGBT or a power MOSFET. Each of the semiconductor chips 41a, 42a, 41b, and 42b has a drain electrode or a collector electrode as an input electrode (main electrode) on the back surface. Furthermore, the semiconductor chip 41a has a gate electrode 41a1 as a control electrode and a source electrode or an emitter electrode as an output electrode (main electrode) on the front surface. The semiconductor chip 42a has a gate electrode 42a1 as a control electrode and a source electrode or an emitter electrode as an output electrode (main electrode) on the front surface. The semiconductor chip 41b has a gate electrode 41b1 as a control electrode and a source electrode or an emitter electrode as an output electrode (main electrode) on the front surface. The semiconductor chip 42b has a gate electrode 42b1 as a control electrode and a source electrode or an emitter electrode as an output electrode (main electrode) on the front surface. The back surfaces of the above semiconductor chips 41a, 42a, 41b, and 42b are bonded to the conductive patterns 23a2 and 23b2, respectively, with solder (not illustrated).

Pb-free solder is used as the solder used for bonding the semiconductor chips 41a through 44a and 41b through 44b to the conductive patterns 23a2 and 23b2, respectively. Pb-free solder contains as a main ingredient an alloy containing at least two of tin, silver, copper, zinc, antimony, indium, bismuth, and the like. Furthermore, the solder may contain an additive. A sintered metal body may be used in place of the solder. Such a sintered metal body contains silver or a silver alloy as a main ingredient. In addition, the above solder or sintered metal body may be used not only for bonding the semiconductor chips 41a through 44a and 41b through 44b to the conductive patterns 23a2 and 23b2, respectively, but also for bonding the first, second, and third wiring members 71, 72, and 74 to the conductive patterns 23a3 and 23a5, 23b2, and 23a2, respectively.

Each of the semiconductor chips 43a, 44a, 43b, and 44b is a diode element which is a free wheeling diode (FWD). Such a diode element includes a Schottky barrier diode (SBD), a pn junction diode, or the like. Each of the semiconductor chips 43a, 44a, 43b, and 44b has a cathode electrode as an output electrode (main electrode) on the back surface and has an anode electrode as an input electrode (main electrode) on the front surface. The back surfaces of the above semiconductor chips 43a, 44a, 43b, and 44b are bonded to the conductive patterns 23a2 and 23b2, respectively, with solder (not illustrated). The semiconductor chips 41a through 44a and 41b through 44b may be reverse conductive (RC)-IGBT elements in which a switching element and a diode element are mounted on one semiconductor chip.

The following bonding wires 51a through 54a, 51b through 54b, 55, and 56 are wired to the insulated circuit boards 20a and 20b and the semiconductor chips 41a through 44a and 41b through 44b. The bonding wires 51a and 52a, which are control wirings, are electrically connected to the conductive pattern 23a1 and are electrically connected to the gate electrodes 41a1 and 42a1 of the semiconductor chips 41a and 42a, respectively. The bonding wires 53a and 54a electrically connect the conductive patterns 23a5 and 23a3, the main electrodes of the semiconductor chips 41a and 42a, and the main electrodes of the semiconductor chips 43a and 44a, respectively.

The bonding wires 51b and 52b, which are control wirings, are electrically connected to the conductive pattern 23b1 and are electrically connected to the gate electrodes 41b1 and 42b1 of the semiconductor chips 41b and 42b, respectively. The bonding wires 53b and 54b electrically connect the conductive patterns 23b5 and 23b3, the main electrodes of the semiconductor chips 41b and 42b, and the main electrodes of the semiconductor chips 43b and 44b, respectively.

Furthermore, the bonding wire 55 electrically connects the conductive pattern 23a2 of the insulated circuit board 20a and the conductive pattern 23b5 of the insulated circuit board 20b and the bonding wire 56 electrically connects the conductive pattern 23a2 of the insulated circuit board 20a and the conductive pattern 23b3 of the insulated circuit board 20b. The bonding wires 51a through 54a, 51b through 54b, 55, and 56 are made of a material having good electrical conductivity. For example, the bonding wires 51a through 54a, 51b through 54b, 55, and 56 are made of metal, such as aluminum or copper, or an alloy containing at least one of them. The diameter of the bonding wires 51a, 52a, 51b, and 52b, which are control wirings, is, for example, greater than or equal to 50 μm and smaller than or equal to 400 μm. The diameter of the bonding wires 53a, 54a, 53b, 54b, 55, and 56 which are main current wirings, is greater than or equal to 300 μm and smaller than or equal to 600 μm.

With the above insulated circuit boards 20a and 20b the one end portion of the first wiring member 71 is connected to the conductive patterns 23a3 and 23a5. The conductive pattern 23a3 is connected via the bonding wire 54a to the main electrodes on the front surfaces of the semiconductor chips 42a and 44a. The conductive pattern 23a5 is connected via the bonding wire 53a to the main electrodes on the front surfaces of the semiconductor chips 41a and 43a. As a result, the first wiring member 71 is electrically connected to the main electrodes of the semiconductor chips 41a, 42a, 43a, and 44a and a main current flows.

Furthermore, the one end portion of the second wiring member 72 is bonded to the conductive pattern 23b2. The conductive patterns 23b2 is electrically connected to the main electrodes on the back surfaces of the semiconductor chips 41b, 42b, 43b, and 44b. As a result, the second wiring member 72 is electrically connected to the main electrodes of the semiconductor chips 41b, 42b, 43b, and 44b and a main current flows.

Furthermore, the one end portion of the third wiring member 74 is bonded to the conductive pattern 23a2. The conductive pattern 23a2 is electrically connected to the main electrodes on the back surfaces of the semiconductor chips 41a through 44a. As a result, the third wiring member 74 is electrically connected to the main electrodes of the semiconductor chips 41a through 44a and a main current flows.

The control terminals 75 and 76 are electrically connected to the conductive patterns 23a1 and 23b1, respectively (not illustrated in detail). A control signal inputted from the outside is inputted via the conductive pattern 23a1 and the bonding wires 51a and 52a to the gate electrodes 41a1 and 42a1 of the semiconductor chips 41a and 42a. A control signal inputted from the outside is inputted via the conductive pattern 23b1 and the bonding wires 51b and 52b to the gate electrodes 41b1 and 42b1 of the semiconductor chips 41b and 42b.

The radiation plate 30 has the shape of a plate and is rectangular in a plan view. The radiation plate 30 contains as a main ingredient metal, such as copper, aluminum, or an alloy containing at least one of them, having high thermal conductivity.

Furthermore, a cooling unit may be fixed to the back surface of the radiation plate 30 of the above semiconductor device 10 with thermal grease therebetween. For example, the thermal grease is silicone with which metal oxide filler is mixed. The cooling unit also contains as a main ingredient a material having high thermal conductivity. Plating treatment may be performed on the surface of the cooling unit as needed. The cooling unit is a heat sink including a plurality of fins, a water-cooling cooler, or the like. In addition, the radiation plate 30 and the cooling unit may be integrally formed.

As illustrated in FIG. 5, the semiconductor device 10 is a half bridge circuit including an upper arm A and a lower arm B. The upper arm A of the semiconductor device 10 includes the insulated circuit board 20b and the bonding wires 51b through 54b, the semiconductor chips 41b through 44b and the second wiring member 72 arranged over the insulated circuit board 20b. Furthermore, the upper arm A of the semiconductor device 10 includes the conductive pattern 23a2 of the insulated circuit board 20a and the third wiring member 74 arranged over the conductive pattern 23a2. The lower arm B of the semiconductor device 10 includes the insulated circuit board 20a and the bonding wires 51a through 54a, the semiconductor chips 41a through 44a and the first wiring member 71 arranged over the insulated circuit board 20a. In addition, the lower arm B of the semiconductor device 10 includes the third wiring member 74. Moreover, the insulated circuit boards 20a and 20b are connected by the bonding wires 55 and 56. As a result, the upper arm A and the lower arm B are connected. By doing so, the semiconductor device 10 functions as a half bridge circuit including the upper arm A and the lower arm B.

In this case, in the semiconductor device 10 a wiring which connects a connection point P connected to a positive electrode of an external power source (not illustrated) and a connection point C1 on the side of the collectors of the semiconductor chips 41b and 42b corresponds to the second wiring member 72. That is to say, the second wiring member 72 is a P terminal which is an input terminal on the positive electrode side in the half bridge circuit. A wiring which connects a connection point M connected to a terminal of a load (not illustrated) and a connection point E1C2 on the side of the emitters of the semiconductor chips 41b and 42b and the collectors of the semiconductor chips 41a and 42a corresponds to the third wiring member 74. That is to say, the third wiring member 74 is an M terminal which is an output terminal in the half bridge circuit. A wiring which connects a connection point N connected to a negative electrode of the external power source and a connection point E2 on the side of the emitters of the semiconductor chips 41a and 42a corresponds to the first wiring member 71. That is to say, the first wiring member 71 is an N terminal which is an input terminal on the negative electrode side in the half bridge circuit.

Next, as illustrated in FIG. 3, the wiring unit 70 includes the first wiring member 71, the second wiring member 72, and the wiring holding portion 73 which includes and holds the first wiring member 71 and the second wiring member 72. Each of the first wiring member 71 and the second wiring member 72 is a plate-shaped lead frame. That is to say, each of the first wiring member 71 and the second wiring member 72 has a principal plane (principal surface) parallel to an X-Y plane corresponding to the front surface and the back surface of the semiconductor device 10 and has a principal plane parallel to a Y-Z plane corresponding to one pair of opposite sides of the semiconductor device 10. Each of the first wiring member 71 and the second wiring member 72 has a side parallel to an X-Z plane corresponding to the other pair of opposite sides of the semiconductor device 10.

With the first wiring member 71, as illustrated in FIGS. 3 and 6, the first horizontal portion 71a and the first vertical portion 71b form the shape of the letter "L" at a first bent portion 71c in a side view, that is to say, when the first wiring member 71 is viewed from a direction (Y direction) parallel to the principal plane. Specifically, one end of the first horizontal portion 71a and one end of the first vertical portion 71b connect at the first bent portion 71c. Furthermore, the first horizontal portion 71a extends from the first bent portion 71c parallel to the principal planes (X-Y plane) of the semiconductor chips 41a through 44a and the insulated circuit board 20a in a direction (-X direction) opposite to the second wiring member 72. The first vertical portion 71b extends upward (in the +Z direction) from the first bent portion 71c perpendicularly to the principal planes (X-Y plane) of the semiconductor chips 41a through 44a and the insulated circuit board 20a. The first bent portion 71c has a curved surface at a corner portion of the back surface of the first horizontal portion 71a (opposite the semiconductor chips 41a through 44a) and a surface of the first vertical portion 71b opposite a surface of the second vertical portion 72b. A second bent portion 72c has a curved surface at a corner portion of the back surface of the second horizontal portion 72a (opposite the semiconductor chips 41b through 44b) and the surface of the second vertical portion 72b opposite the surface of the first vertical portion 71b. The curvature of the first bent portion 71c on the external angle side may be equal to that of second bent portion 72c on the external angle side. For example, if the thickness of the first wiring member 71 is T1, then the curvature of the first bent portion 71c on the external angle side is 1/T1. If the thickness of the second wiring member 72 is T2, then the curvature of the second bent portion 72c on the external angle side is 1/T2. In addition, the first wiring member 71 includes the first leg portion 71d and the first external connection portion 71e. The first horizontal portion 71a is formed between the insulated circuit board 20a and the lid portion 61 of the case 60 at determined distance from them in the height direction (in the Z direction). On the other hand, as stated above, the one end portion of the first wiring member 71 is electrically connected to the conductive patterns 23a3 and 23a5 and the other end portion of the first wiring member 71 extends from the lid portion 61 of the case 60 to the outside. The first leg portion 71d extends downward (in the -Z direction) from the other end of the first horizontal portion 71a and includes the one end portion of the first wiring member 71 connected to the conductive patterns 23a3 and 23a5. The first external connection portion 71e further extends upward (in the +Z direction) from the other end of the first vertical portion 71b with respect to the semiconductor chips 41a through 44a (insulated circuit board 20a) and includes the other end portion of the first wiring member 71 extending from the lid portion 61 of the case 60 to the outside. FIG. illustrates a case where the first external connection portion 71e extends upward. The first external connection portion 71e may be exposed from the lid portion 61 to the outside, be bent at a dashed line, and extend parallel to the upper surface of the lid portion 61 in a direction (-X direction) opposite to the second wiring member 72.

With the second wiring member 72, as illustrated in FIGS. 3 and 6, the second horizontal portion 72a and the second vertical portion 72b form the shape of the letter "L" at the second bent portion 72c in a side view, that is to say, when the second wiring member 72 is viewed from a direction (Y direction) parallel to the principal plane. Specifically, one end of the second horizontal portion 72a and one end of the second vertical portion 72b connect at the second bent portion 72c. Furthermore, the second horizontal portion 72a extends from the second bent portion 72c parallel to the principal planes (X-Y plane) of the semiconductor chips 41a through 44a and the insulated circuit board 20a in a direction (+X direction) opposite to the first wiring member 71. The second horizontal portion 72a is flush with the first horizontal portion 71a. The second vertical portion 72b extends upward (in the +Z direction) from the second bent portion 72c perpendicularly to the principal planes (X-Y plane) of the semiconductor chips 41a through 44a and the insulated circuit board 20a. That is to say, the principal plane of the second vertical portion 72b is parallel to the principal plane of the first vertical portion 71b and the second vertical portion 72b and the first vertical portion 71b are formed with a determined distance between them. The distance between the principal plane of the first vertical portion 71b and the principal plane of the second vertical portion 72b is set according to current and voltage applied to the first wiring member 71 and the second wiring member 72. The distance between the principal plane of the first vertical portion 71b and the principal plane of the second vertical portion 72b is preferably longer than or equal to 0.25 mm and shorter than or equal to 4.0 mm and is more preferably longer than or equal to 0.5 mm and shorter than or equal to 2.0 mm. If the distance between the principal plane of the first vertical portion 71b and the principal plane of the second vertical portion 72b is too short, then insulation between the first wiring member 71 and the second wiring member 72 deteriorates and a short circuit may occur between them. Moreover, if the distance between the principal plane of the first vertical portion 71b and the principal plane of the second vertical portion 72b is too long, then inductance is not decreased. Furthermore, the width (length in the Y direction) of the second vertical portion 72b is smaller than the width (length in the Y direction) of the first vertical portion 71b. The first vertical portion 71b and the second vertical portion 72b are arranged so that their center lines which intersect with the width direction at right angles will match in a plan view (see FIG. 13). In addition, another case is possible. That is to say, the width (length in the Y direction) of the first vertical portion 71b and the width (length in the Y direction) of the second vertical portion 72b need only differ from each other. For example, the width (length in the Y direction) of the first vertical portion 71b may be smaller than the width (length in the Y direction) of the second vertical portion 72b. This suppresses concentration of stress applied from the sides of the first vertical portion 71b and the second vertical portion 72b to the wiring holding portion 73. As a result, the appearance of a crack or the like in the wiring holding portion 73 is suppressed further.

Furthermore, the second wiring member 72 includes the second leg portion 72d, the second external connection portion 72e, and a connection portion 72f. The second horizontal portion 72a is formed between the insulated circuit board 20b and the lid portion 61 of the case 60 at a determined distance from them in the height direction (in the Z direction). On the other hand, as stated above, the one end portion of the second wiring member 72 is electrically connected to the conductive pattern 23b2 and the other end portion of the second wiring member 72 extends from the lid portion 61 of the case 60 to the outside. The second leg portion 72d extends downward (in the −Z direction) from the other end of the second horizontal portion 72a and includes the one end portion of the second wiring member 72 connected to the conductive pattern 23b2. The second external connection portion 72e further extends upward (in the +Z direction) from the second vertical portion 72b with respect to the semiconductor chips 41b through 44b (insulated circuit board 20b) and includes the other end portion of the second wiring member 72 extending from the lid portion 61 of the case 60 to the outside. FIG. 6 illustrates a case where the second external connection portion 72e extends upward. The second external connection portion 72e may be exposed from the lid portion 61 to the outside, be bent at a dashed line, and extend parallel to the upper surface of the lid portion 61 in a direction (+X direction) opposite to the first wiring member 71. The connection portion 72f extends from the second vertical portion 72b in a direction away from the first vertical portion 71b. That is to say, the connection portion 72f is parallel to the second horizontal portion 72a and connects an upper end portion of the second vertical portion 72b and a lower end portion of the second external connection portion 72e. As a result, the first external connection portion 71e and the second external connection portion 72e are arranged the total of a gap between the first vertical portion 71b and the second vertical portion 72b and the length of the connection portion 72f apart.

As illustrated in FIGS. 7A and 7B, the width (length in the Y direction) of the second bent portion 72c of the second wiring member 72 is smaller than the width (length in the Y direction) of the first bent portion 71c of the first wiring member 71. Furthermore, the second horizontal portion 72a of the second wiring member 72 has a curved surface at a corner portion at which the back surface (opposite the front surface of the insulated circuit board 20a parallel to the X-Y plane) and a side (parallel to the X-Z plane) in the width direction intersect. For example, an R-shape having a determined curvature is formed. For example, if the thickness of the second horizontal portion 72a is $T_{72a}$, then at this time curvature (1/R) is greater than or equal to $0.05/T_{72a}$ and smaller than or equal to $0.5/T_{72a}$.

The shape of the first leg portion 71d, the second leg portion 72d, the first external connection portion 71e, and the second external connection portion 72e illustrated in FIG. 3 is an example. The first leg portion 71d or the second leg portion 72d need only have a shape by which the first leg portion 71d or the second leg portion 72d is electrically connected to the conductive patterns 23a3 and 23a5 or the conductive pattern 23b2. Furthermore, the first external connection portion 71e or the second external connection portion 72e need only have a shape by which the first external connection portion 71e or the second external connection portion 72e is exposed from the lid portion 61 and is electrically connected to an external device.

Furthermore, as illustrated in FIG. 3, the third wiring member 74 includes a third horizontal portion 74a parallel to the principal planes of the semiconductor chips 41a through 44a (insulated circuit board 20a), the third leg portion 74d, and the third external connection portion 74e perpendicular to the third horizontal portion 74a, in a side view. The one end portion of the third wiring member 74 is electrically connected to the conductive pattern 23a2 and the other end portion of the third wiring member 74 extends from the lid portion 61 of the case 60 to the outside. The third leg portion 74d includes the one end portion of the third wiring member 74 extending from the third horizontal portion 74a to the conductive pattern 23a2 and connected to the conductive pattern 23a2. The third external connection portion 74e extends upward from the third horizontal portion 74a with respect to the semiconductor chips 41a through 44a (insulated circuit board 20a) and includes the other end portion of the third wiring member 74 extending from the lid portion 61 of the case 60 to the outside. FIG. 3 illustrates a case where the third external connection portion 74e extends upward from the lid portion 61 and where the third external connection portion 74e is bent to the side of the front surface of the lid portion 61.

The first wiring member 71, the second wiring member 72, and the third wiring member 74 contain as a main ingredient metal, such as aluminum, copper, iron, nickel, or an alloy containing at least one of them, having good electrical conductivity. In order to improve corrosion resistance, plating treatment may also be performed on the surfaces of the first wiring member 71, the second wiring member 72, and the third wiring member 74. At this time nickel, a nickel-phosphorus alloy, a nickel-boron alloy or the like is used as a plating material. Furthermore, metal or a sintered metal body is used for bonding the first wiring member 71, the second wiring member 72, and the third wiring member 74 to the conductive patterns 23a3 and 23a5, the conductive pattern 23b2, and the conductive pattern 23a2, respectively. This is the same with a case where the semiconductor chips 41a through 44a and 41b through 44b are bonded to the conductive patterns 23a2 and 23b2, respectively. In addition, the first wiring member 71, the second wiring member 72, and the third wiring member 74 may be bonded directly to the conductive patterns 23a3 and 23a5, the conductive pattern 23b2, and the conductive pattern 23a2, respectively, by the use of ultrasonic waves or a laser.

As illustrated in FIG. 8, the wiring holding portion 73 includes at least a first portion 73a with which a gap between the first vertical portion 71b of the first wiring member 71 and the second vertical portion 72b of the second wiring member 72 and a gap between the first bent portion 71c of the first wiring member 71 and the second bent portion 72c of the second wiring member 72 are filled. Furthermore, the wiring holding portion 73 may include the external angle sides of the first bent portion 71c and the second bent portion 72c. The external angle sides of the first bent portion 71c and the second bent portion 72c indicate the corner portion of the back surface of the first horizontal portion 71a and the surface of the first vertical portion 71b opposite the surface of the second vertical portion 72b and the corner portion of the back surface of the second horizontal portion 72a and the surface of the second vertical portion 72b opposite the surface of the first vertical portion 71b, respectively.

Furthermore, the wiring holding portion 73 includes a second portion 73b1 including the principal plane of the first vertical portion 71b opposite to (on the −X side of) the second vertical portion 72b and the interior angle side of the first bent portion 71c. In addition, the wiring holding portion 73 includes a second portion 73b2 including the principal plane of the second vertical portion 72b opposite to (on the +X side of) the first vertical portion 71b and the interior angle side of the second bent portion 72c. Moreover, the wiring holding portion 73 includes part of the principal plane of the first horizontal portion 71a of the first wiring member 71 and part of the principal plane of the second horizontal portion 72a of the second wiring member 72. Furthermore, as illustrated in FIG. 2, the wiring holding portion 73 may also cover the sides of the first vertical portion 71b and the second vertical portion 72b. Accordingly, one or both of the first vertical portion 71b and the second vertical portion 72b may be completely included in the wiring holding portion 73. In addition, as illustrated in FIG. 3, the wiring holding portion 73 includes the connection portion 72f of the second wiring member 72. That is to say, the upper surface of the wiring holding portion 73 need only reach a level at which the connection portion 72f is completely included in the wiring holding portion 73. Moreover, a lower surface 73a1 of the first portion 73a is flush with the lower surfaces of the first horizontal portion 71a and the second horizontal portion 72a.

The above wiring holding portion 73 is made of an insulating resin such as a thermoplastic resin. A thermoplastic resin is polyphenylene sulfide resin, polybutylene terephthalate resin, polybutylene succinate resin, polyamide resin, acrylonitrile butadiene styrene resin, or the like. Furthermore, an insulating ceramic filler, such as an oxide, a nitride, or a carbide, may be added to such a thermoplastic resin. Silicon, aluminum, or boron is taken as a concrete example.

With the wiring unit 70, areas of the first wiring member 71 and the second wiring member 72 adjacent to each other are included in the above way in the wiring holding portion 73. This particularly relaxes stress applied to the wiring holding portion 73 near the first bent portion 71c and the second bent portion 72c in which stress tends to concentrate, while maintaining insulation between the first wiring member 71 and the second wiring member 72. Furthermore, the occurrence of damage, such as a crack, to the wiring holding portion 73 near the first bent portion 71c and the second bent portion 72c is suppressed. In addition, the second external connection portion 72e of the second wiring member 72 is apart from the second vertical portion 72b because of the presence of the connection portion 72f. Accordingly, when the second wiring member 72 is bonded to the conductive pattern 23b2, stress applied to the second bent portion 72c is relaxed. This also contributes to suppression of the occurrence of damage to the wiring holding portion 73 near the second bent portion 72c.

Furthermore, the first horizontal portion 71a and the second horizontal portion 72a extend in opposite directions. As a result, the first leg portion 71d and the second leg portion 72d are apart from each other. Accordingly, insulation between the first leg portion 71d and the second leg portion 72d is kept and there is no need for the wiring holding portion 73 to include the first leg portion 71d and the second leg portion 72d. This suppresses the occurrence of damage to the wiring holding portion 73 near the first bent portion 71c and the second bent portion 72c. In addition, the first external connection portion 71e and the second external connection portion 72e over the upper surface of the wiring holding portion 73 are apart from each other because of the presence of the connection portion 72f. Accordingly, insulation between the first external connection portion 71e and the second external connection portion 72e is kept. As a result, there is no need for the wiring holding portion 73 to include the first external connection portion 71e and the second external connection portion 72e and the occurrence of damage to the wiring holding portion 73 near the first bent portion 71c and the second bent portion 72c is suppressed. As described later, the first horizontal portion 71a and the first leg portion 71d of the first wiring member 71 and the second horizontal portion 72a and the second leg portion 72d of the second wiring member 72 not included in the wiring holding portion 73 may be sealed with the sealing member 80.

Furthermore, the curved surface having small curvature is formed at the corner portion of the back surface of the second horizontal portion 72a of the second wiring member 72 (see FIGS. 7A and 7B). Accordingly, stress applied to the second horizontal portion 72a of the second wiring member 72 is dispersed. This also contributes to suppression of the occurrence of damage to the wiring holding portion 73 near the second horizontal portion 72a. Because the occurrence of damage to the wiring holding portion 73 is suppressed in this way, insulation between the first wiring member 71 near the first bent portion 71c and the second wiring member 72 near the second bent portion 72c is particularly maintained.

The insulated circuit boards 20a and 20b, the semiconductor chips 41a through 44a and 41b through 44b, and the bonding wires 51a through 54a, 51b through 54b, 55, and 56 over the radiation plate 30 are sealed with the sealing member 80. Furthermore, an area over the first horizontal portion 71a and the second horizontal portion 72a of the first wiring member 71 and the second wiring member 72, respectively, of the wiring unit 70 illustrated in FIG. 3 and under the upper surface of the wiring holding portion 73 is filled with the sealing member 80. An area from over the first horizontal portion 71a and the second horizontal portion 72a to the wiring holding portion 73 corresponding to the connection portion 72f is more preferably filled with the sealing member 80.

With the wiring unit 70, as stated above, at this time areas of the first wiring member 71 and the second wiring member 72 adjacent to each other are included in the wiring holding portion 73. The first horizontal portion 71a and the first leg portion 71d of the first wiring member 71 and the second horizontal portion 72a and the second leg portion 72d of the second wiring member 72 not included in the wiring holding portion 73 are sealed with the sealing member 80 and insulation between the first horizontal portion 71a and the second horizontal portion 72a and insulation between the first leg portion 71d and the second leg portion 72d are kept. Furthermore, even if the first external connection portion 71e or the second external connection portion 72e over the upper surface of the wiring holding portion 73 is not sealed with the sealing member 80, insulation between the first external connection portion 71e and the second external connection portion 72e is kept because they are apart from each other because of the presence of the connection portion 72f. In addition, the first external connection portion 71e and the second external connection portion 72e extend from the lid portion 61 to the outside, are bent in opposite directions, and are apart from each other. Accordingly, insulation between the first external connection portion 71e and the second external connection portion 72e is kept.

Furthermore, there is need to heighten the side wall portions 62a through 62d of the case 60 so as to fill the inside of the side wall portions 62a through 62d with the sealing member 80. Accordingly, there is need to make the height of the side wall portions 62a through 62d greater than heights corresponding to the insulated circuit boards 20a and 20b, the semiconductor chips 41a through 44a and 41b through 44b, and the bonding wires 51a through 54a, 51b through 54b, 55, and 56.

Silicone gel is used as the sealing member 80. Alternatively, the sealing member 80 contains a thermosetting resin and a filling material contained in a thermosetting resin. A thermosetting resin is epoxy resin, phenolic resin, maleimide resin, or the like. An example of the sealing member 80 is epoxy resin containing a filling material. Inorganic matter, such as silicon oxide, aluminum oxide, boron nitride, or aluminum nitride, is used as a filling material.

The above semiconductor device 10 includes the semiconductor chips 41a through 44a and 41b through 44b and the wiring unit 70. The wiring unit 70 includes the first wiring member 71 and the second wiring member 72 whose one end portions are electrically connected to the semiconductor chips 41a through 44a and 41b through 44b, respectively, and the wiring holding portion 73 including part of the first wiring member 71 and part of the second wiring member 72.

The first wiring member 71 is bent at the first bent portion 71c so as to form the shape of the letter "L" in a side view, and includes the first horizontal portion 71a parallel to the principal planes of the semiconductor chips 41a through 44a and the first vertical portion 71b perpendicular to the first horizontal portion 71a. The second wiring member 72 is bent at the second bent portion 72c in a direction opposite to the first wiring member 71 so as to form the shape of the letter "L" in a side view, and includes the second horizontal portion 72a flush with the first horizontal portion 71a and the second vertical portion 72b parallel to the first vertical portion 71b and a determined distance distant from the first vertical portion 71b. Furthermore, the gap between the first vertical portion 71b and the second vertical portion 72b and the gap between the first bent portion 71c and the second bent portion 72c are filled with the first portion 73a of the wiring holding portion 73.

With the above semiconductor device 10, the first bent portion 71c of the first wiring member 71 and the second bent portion 72c of the second wiring member 72 are included in the wiring holding portion 73. Accordingly, insulation between the first wiring member 71 and the second wiring member 72 is ensured. Furthermore, stress applied to the vicinity of the first bent portion 71c or the second bent portion 72c is relaxed. This prevents the occurrence of damage, such as a crack, to the wiring holding portion 73 and insulation between the first wiring member 71 and the second wiring member 72 included in the wiring holding portion 73 is kept. In addition, the first horizontal portion 71a and the first leg portion 71d of the first wiring member 71 and the second horizontal portion 72a and the second leg portion 72d of the second wiring member 72 are not included in the wiring holding portion 73. The first horizontal portion 71a and the second horizontal portion 72a are apart from each other and the first leg portion 71d and the second leg portion 72d are apart from each other. The first horizontal portion 71a and the second horizontal portion 72a are sealed with the sealing member 80 and the first leg portion 71d and the second leg portion 72d are sealed with the sealing member 80. As a result, insulation between the first horizontal portion 71a and the second horizontal portion 72a and insulation between the first leg portion 71d and the second leg portion 72d are kept. Moreover, even if the first external connection portion 71e or the second external connection portion 72e over the upper surface of the wiring holding portion 73 is not sealed with the sealing member 80, the first external connection portion 71e and the second external connection portion 72e are apart from each other because of the presence of the connection portion 72f. As a result, insulation between the first external connection portion 71e and the second external connection portion 72e is kept. This suppresses a reduction in the insulation resistance of the wiring unit 70, prevents damage to the semiconductor device 10, and suppresses deterioration in the reliability of the semiconductor device 10.

With the wiring unit 70 included in the semiconductor device 10, stress applied to the vicinity of the first bent portion 71c or the second bent portion 72c is relaxed and insulation is improved, by keeping the distance between the lower surface 73a1 of the wiring holding portion 73 and the first bent portion 71c and the distance between the lower surface 73a1 of the wiring holding portion 73 and the second bent portion 72c. Various modifications in which the distance between the lower surface 73a1 of the wiring holding portion 73 and the first bent portion 71c and the distance between the lower surface 73a1 of the wiring holding portion 73 and the second bent portion 72c are kept will now be described.

Modification 1

Figure 9:
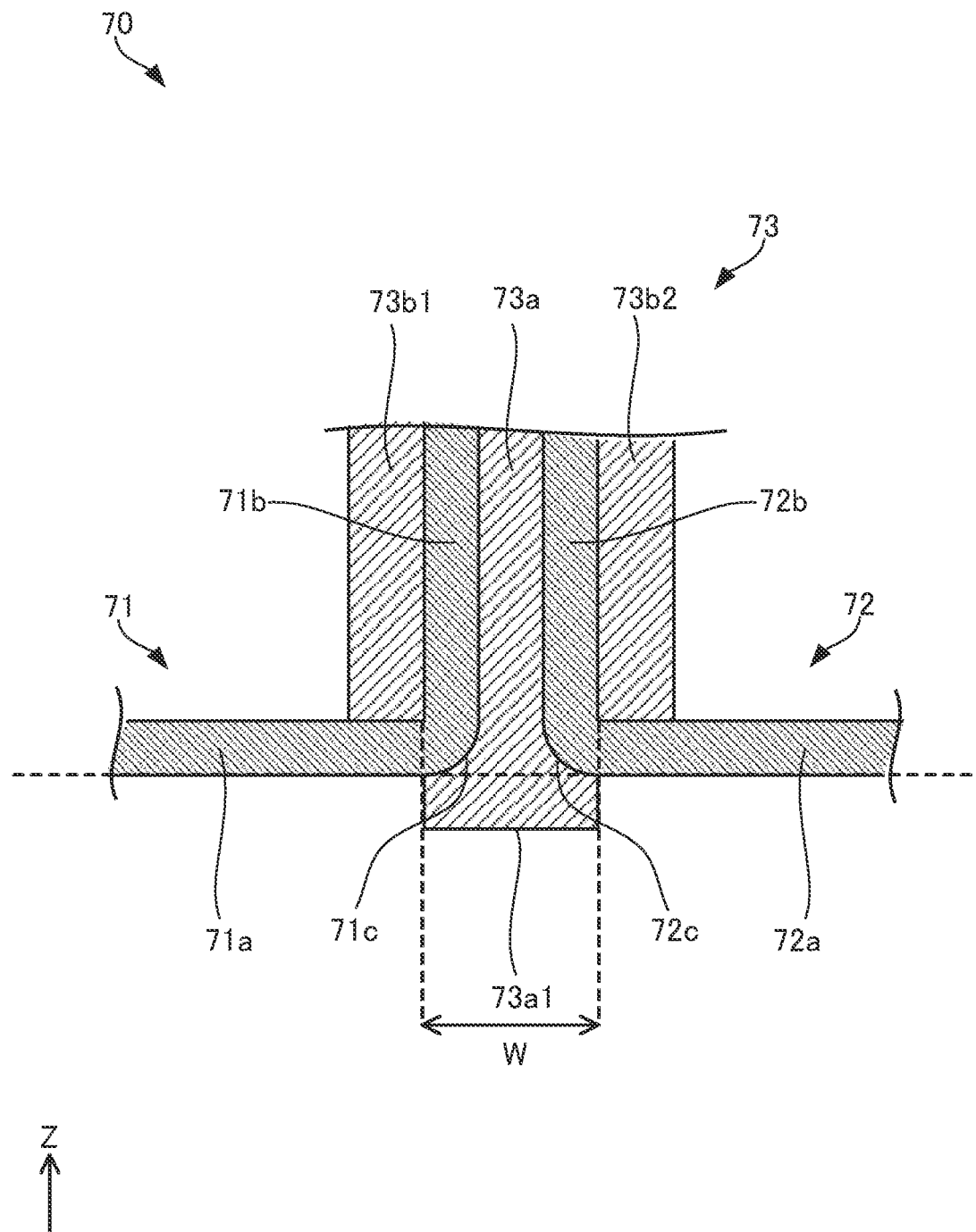
FIG. 9 is a fragmentary sectional view of a wiring unit included in modification 1 of the semiconductor device according to the first embodiment.

Modification 1 of the wiring unit 70 will be described with reference to FIG. 9. FIG. 9 is a fragmentary sectional view of a wiring unit included in modification 1 of the semiconductor device according to the first embodiment. With a wiring unit 70 included in modification 1 of the semiconductor device according to the first embodiment, a lower surface 73a1 of a first portion 73a of a wiring holding portion 73 protrudes from back surfaces of a first horizontal portion 71a and a second horizontal portion 72a toward front surfaces of insulated circuit boards 20a and 20b (in the −Z direction in FIG. 9), compared with the wiring unit 70 illustrated in FIG. 8. A protrusion amount of the lower surface 73a1 of the first portion 73a from the back surfaces of the first horizontal portion 71a and the second horizontal portion 72a may be 50 percent or more of the distance between the principal plane of a first vertical portion 71b and the principal plane of a second vertical portion 72b and 200 percent or less of the distance between the principal plane of the first vertical portion 71b and the principal plane of the second vertical portion 72b. For example, a protrusion amount of the lower surface 73a1 of the first portion 73a from the back surfaces of the first horizontal portion 71a and the second horizontal portion 72a is larger than or equal to 0.25 mm and smaller than or equal to 4.0 mm. A protrusion amount of the lower surface 73a1 of the first portion 73a from the back surfaces of the first horizontal portion 71a and the second horizontal portion 72a is more preferably larger than or equal to 0.5 mm and smaller than or equal to 2.0 mm. Accordingly, the distance between the lower surface 73a1 of the first portion 73a of the wiring holding portion 73 and a first bent portion 71c of a first wiring member 71 and the distance between the lower surface 73a1 of the first portion 73a of the wiring holding portion 73 and a second bent portion 72c of a second wiring member 72 are long, compared with the case of FIG. 8. The width in the X direction of the wiring holding portion 73 is set to a value larger than or equal to at least width W between the first bent portion 71c and the second bent portion 72c. This ensures a determined thickness of the first portion 73a in a direction perpendicular to curved surfaces on the external angle sides of the first bent portion 71c and the second bent portion 72c. As a result, stress applied to the wiring holding portion 73 near the first bent portion 71c of the first wiring member 71 and the second bent portion 72c of the second wiring member 72 is relaxed and damage hardly occurs. Accordingly, the damage resistance of the wiring holding portion 73 of the wiring unit 70 is improved. Furthermore, because the occurrence of damage is suppressed, insulation is maintained.

Modification 2

Figure 10:
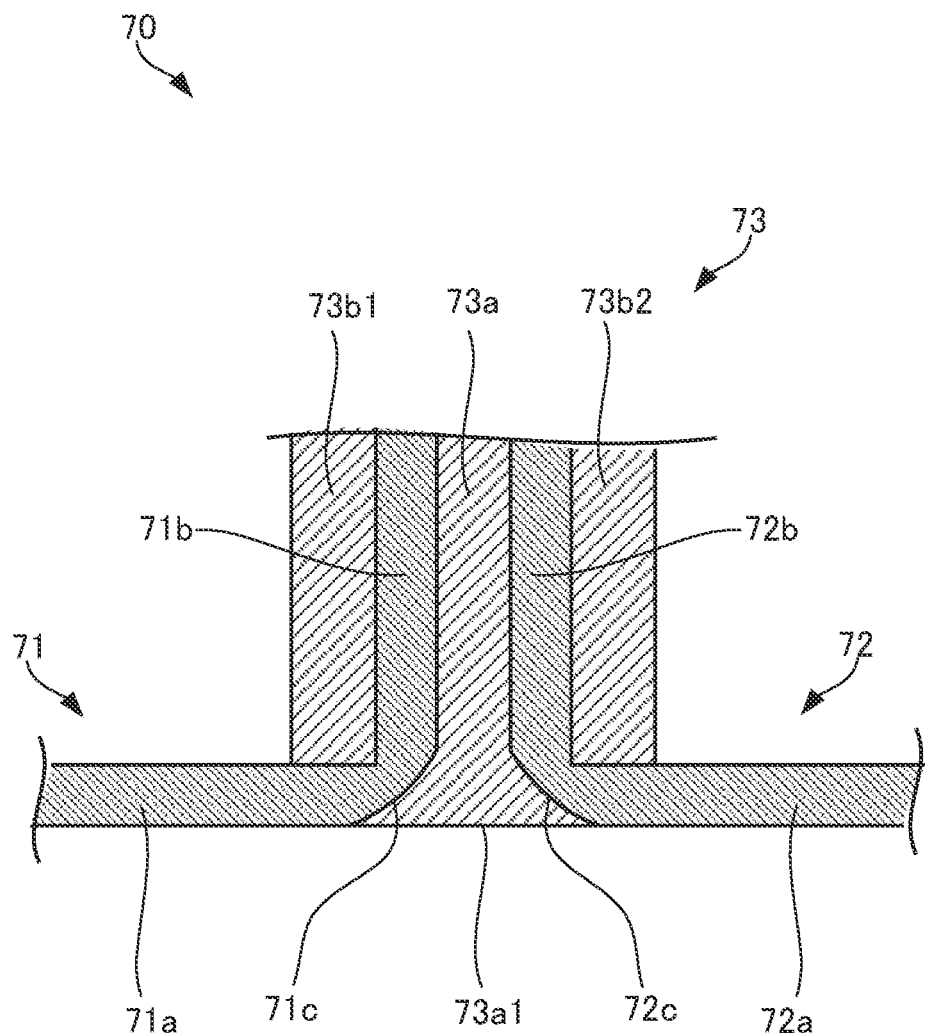
FIG. 10 is a fragmentary sectional view of a wiring unit included in modification 2 of the semiconductor device according to the first embodiment.

Modification 2 of the wiring unit 70 will be described with reference to FIG. 10. FIG. 10 is a fragmentary sectional view of a wiring unit included in modification 2 of the semiconductor device according to the first embodiment. With a wiring unit 70 included in modification 2 of the semiconductor device according to the first embodiment, the curvature of a first bent portion 71c of a first wiring member 71 and a second bent portion 72c of a second wiring member 72 is smaller than that of the first bent portion 71c of the first wiring member 71 and the second bent portion 72c of the second wiring member 72, respectively, included in the wiring unit 70 illustrated in FIG. 8. That is to say, with the wiring unit 70 included in modification 2 of the semiconductor device according to the first embodiment, the first bent portion 71c of the first wiring member 71 and the second bent portion 72c of the second wiring member 72 curve more gently than the first bent portion 71c of the first wiring member 71 and the second bent portion 72c of the second wiring member 72, respectively, included in the wiring unit 70 illustrated in FIG. 8. For example, if the thickness of the first wiring member 71 is T1, then the curvature of the first bent portion 71c on the external angle side is smaller than 1/T1. If the thickness of the second wiring member 72 is T2, then the curvature of the second bent portion 72c on the external angle side is smaller than 1/T2. Furthermore, in this case, the curvature of the first bent portion 71c on the external angle side may be equal to the curvature of the second bent portion 72c on the external angle side. Accordingly, the distance between a lower surface 73a1 of a first portion 73a of a wiring holding portion 73 and the first bent portion 71c of the first wiring member 71 and the distance between the lower surface 73a1 of the first portion 73a of the wiring holding portion 73 and the second bent portion 72c of the second wiring member 72 are long, compared with the case of FIG. 8. As a result, stress applied to the wiring holding portion 73 near the first bent portion 71c of the first wiring member 71 and the second bent portion 72c of the second wiring member 72 is relaxed and damage hardly occurs. Accordingly, the damage resistance of the wiring holding portion 73 of the wiring unit 70 is improved. Furthermore, because the occurrence of damage is suppressed, insulation is maintained.

Furthermore, in modification 2, the lower surface 73a1 of the first portion 73a of the wiring holding portion 73 may protrude from back surfaces of a first horizontal portion 71a and a second horizontal portion 72a toward front surfaces of insulated circuit boards 20a and 20b. This is the same with modification 1. This further prevents the occurrence of damage to the wiring holding portion 73 of the wiring unit 70.

Modification 3

Figure 11:
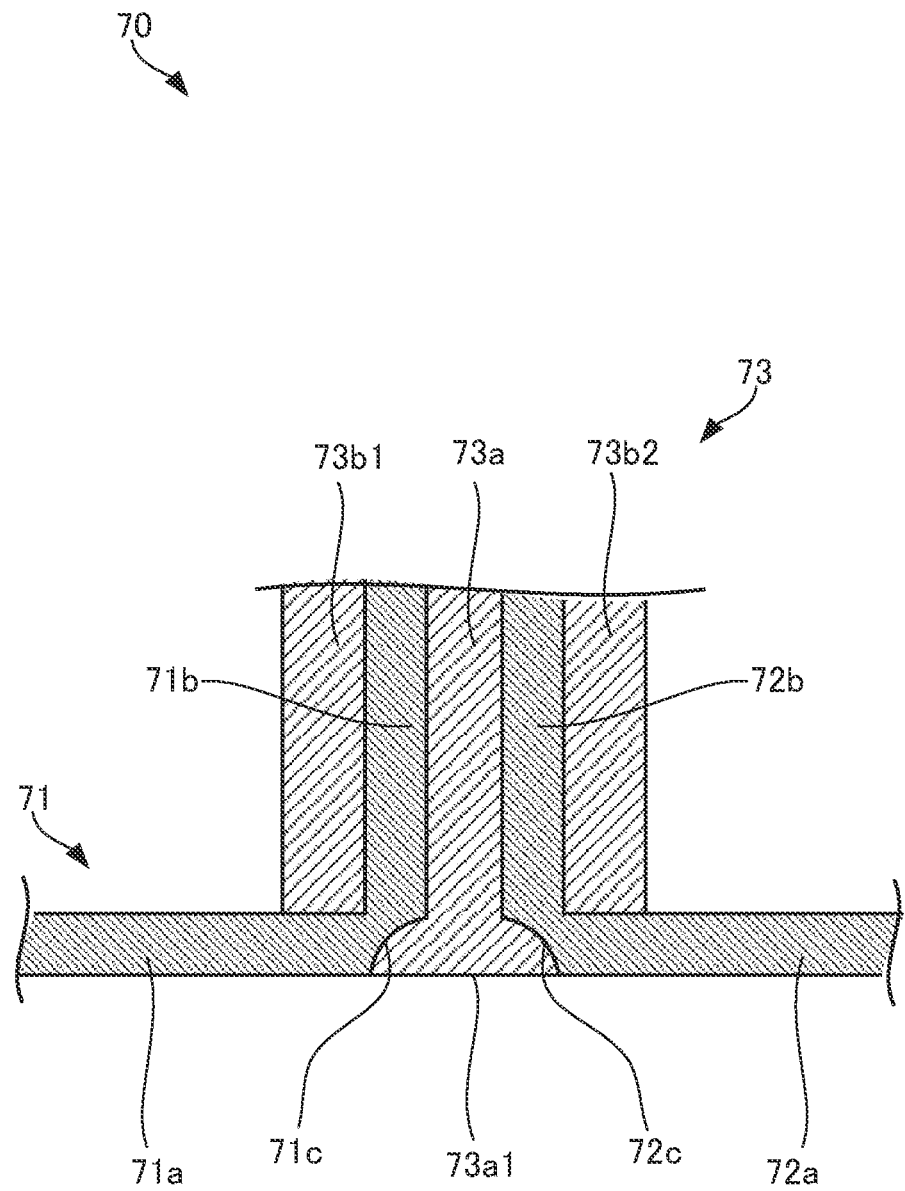
FIG. 11 is a fragmentary sectional view of a wiring unit included in modification 3 of the semiconductor device according to the first embodiment.

Modification 3 of the wiring unit 70 will be described with reference to FIG. 11. FIG. 11 is a fragmentary sectional view of a wiring unit included in modification 3 of the semiconductor device according to the first embodiment. With a wiring unit 70 included in modification 3 of the semiconductor device according to the first embodiment, a notch portion is formed in each of the first bent portion 71c on the gap side of the first wiring member 71 and the second bent portion 72c on the gap side of the second wiring member 72 illustrated in FIG. 8. Accordingly, the distance between a lower surface 73a1 of a first portion 73a of a wiring holding portion 73 and the first bent portion 71c of the first wiring member 71 and the distance between the lower surface 73a1 of the first portion 73a of the wiring holding portion 73 and the second bent portion 72c of the second wiring member 72 are long, compared with the case of FIG. 8. As a result, stress applied to the wiring holding portion 73 near the first bent portion 71c of the first wiring member 71 and the second bent portion 72c of the second wiring member 72 is relaxed and damage hardly occurs. Accordingly, the damage resistance of the wiring holding portion 73 of the wiring unit 70 is improved. Furthermore, because the occurrence of damage is suppressed, insulation is maintained.

Furthermore, in modification 3, the lower surface 73a1 of the first portion 73a of the wiring holding portion 73 may protrude from back surfaces of a first horizontal portion 71a and a second horizontal portion 72a toward front surfaces of insulated circuit boards 20a and 20b. This is the same with modification 1. This further prevents the occurrence of damage to the wiring holding portion 73 of the wiring unit 70.

Second Embodiment

Figure 12B:
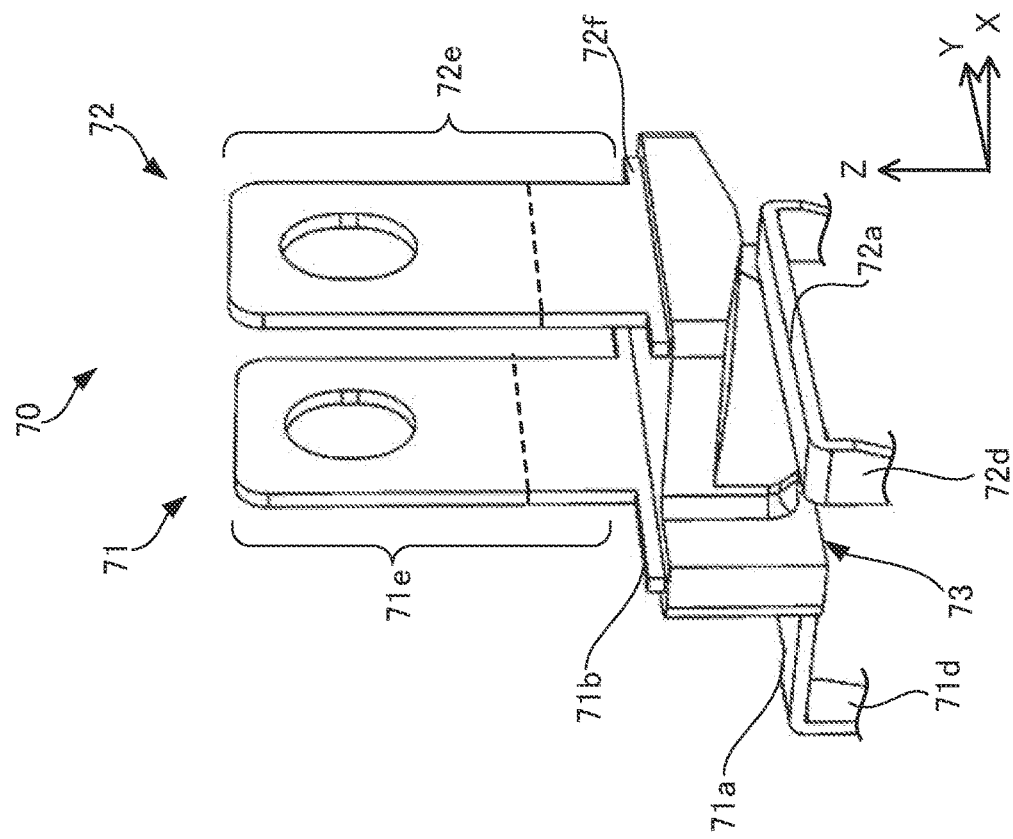
FIGS. 12A and 12B illustrate a wiring unit included in a semiconductor device according to a second embodiment.
Figure 12A:
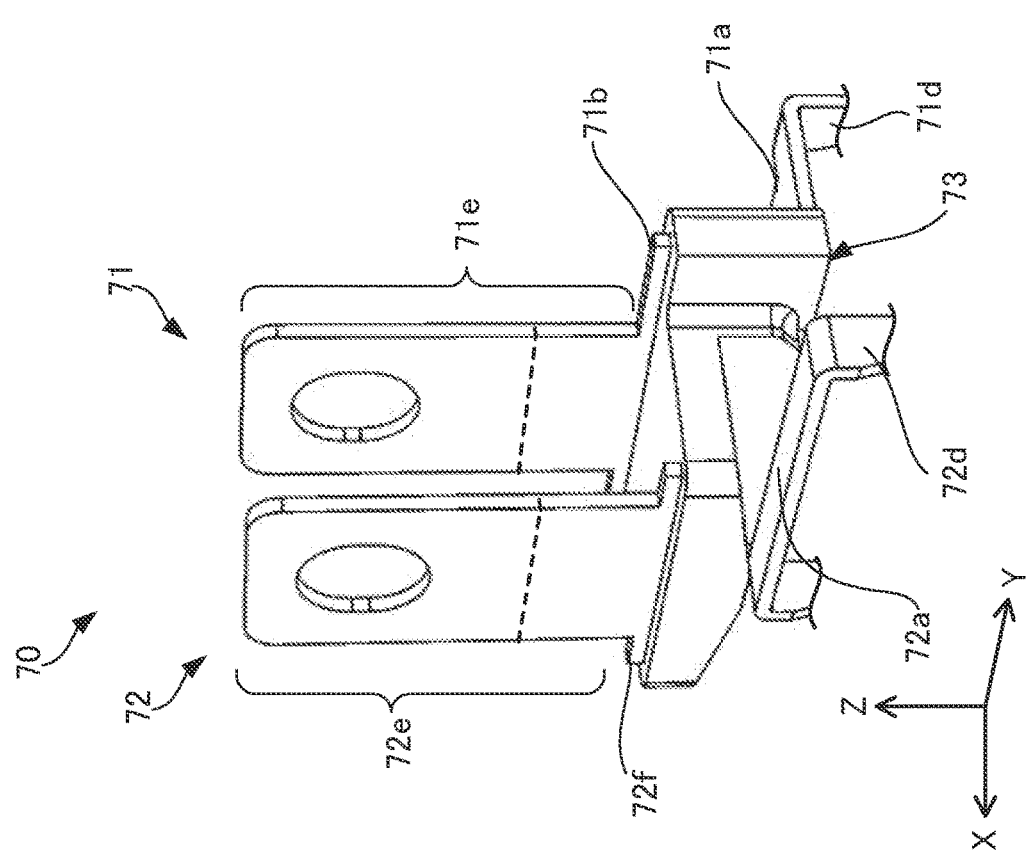
Figure 13:
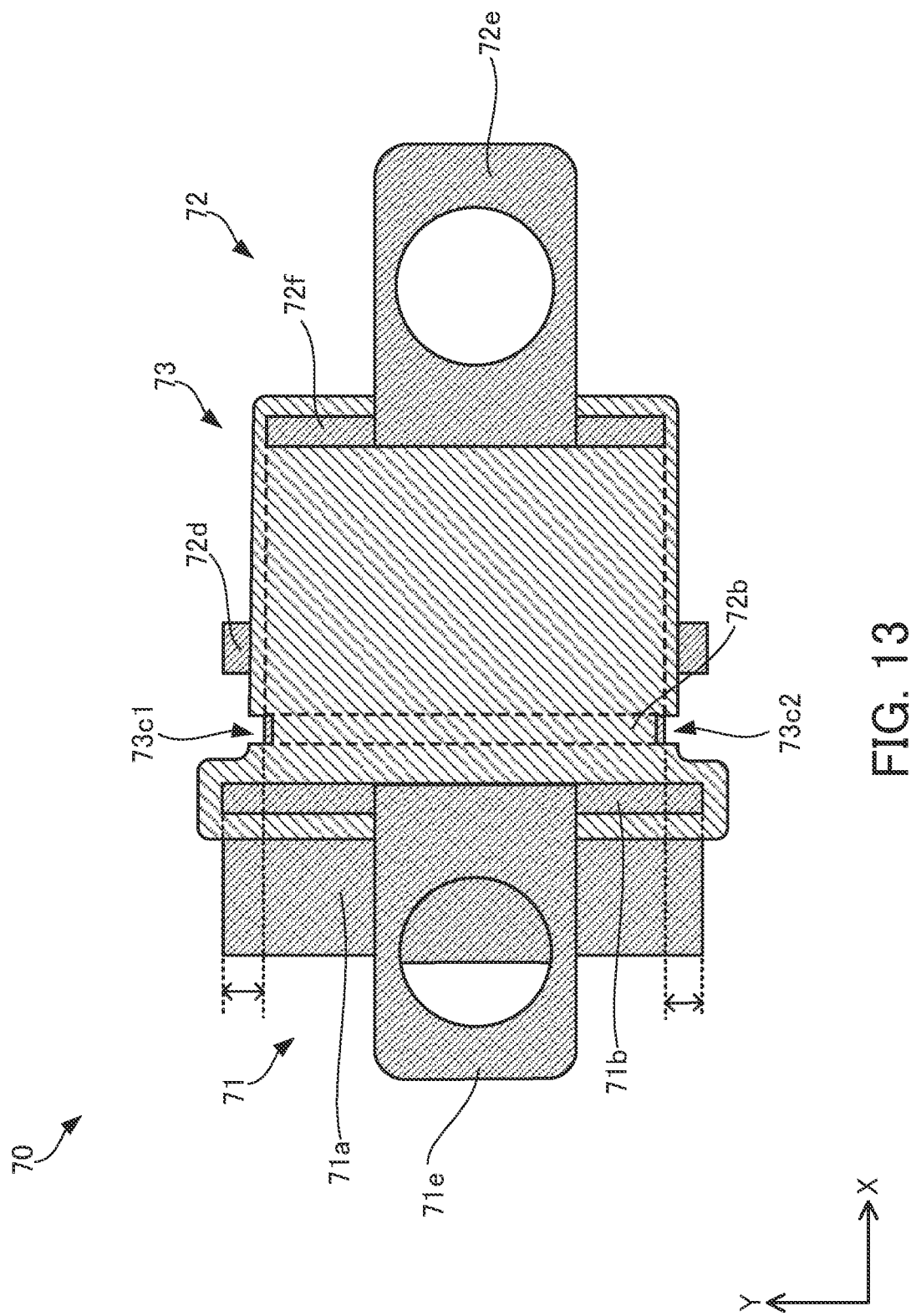
FIG. 13 is a plan view of the wiring unit included in the semiconductor device according to the second embodiment.

A case where an area included in a wiring holding portion 73 of a wiring unit 70 of a semiconductor device according to a second embodiment differs from the area included in the wiring holding portion 73 of the wiring unit 70 illustrated in FIG. 2 will be described with reference to FIGS. 12A, 12B and FIG. 13. FIGS. 12A, 12B and FIG. 13 illustrate a wiring unit included in a semiconductor device according to a second embodiment. FIGS. 12A and 12B are perspective views obtained by viewing a wiring unit 70 from different directions. FIG. 13 is a plan view of the wiring unit 70 included in the semiconductor device according to the second embodiment obtained by viewing the wiring unit 70 from above (from the +Z direction).

Unlike the wiring holding portion 73 of the wiring unit 70 illustrated in FIG. 2, opening portions 73c1 and 73c2 are formed in outer edge portions in the width direction (in the Y direction) of a second vertical portion 72b of the wiring unit 70. That is to say, the outer edge portions in the width direction of the second vertical portion 72b included in the wiring holding portion 73 are exposed from the opening portions 73c1 and 73c2. The opening portions 73c1 and 73c2 are formed in outer edge portions of the wiring holding portion 73 in a direction (in the Z direction) in which the second vertical portion 72b extends.

Even if stress is applied to the outer edge portions in the width direction of the second vertical portion 72b of a second wiring member 72, the wiring holding portion 73 does not suffer damage because the opening portions 73c1 and 73c2 are formed in the outer edge portions of the wiring holding portion 73 including the second wiring member 72. This further suppresses deterioration in the insulation of the wiring holding portion 73. Furthermore, because a first horizontal portion 71a and a first bent portion 71c of a first wiring member 71 are included in the wiring holding portion 73, insulation between the first horizontal portion 71a of the first wiring member 71 and a second horizontal portion 72a of the second wiring member 72 is maintained more properly. As a result, deterioration in the insulation of the wiring holding portion 73 is suppressed, compared with the case of FIG. 2.

Third Embodiment

Figure 14A:
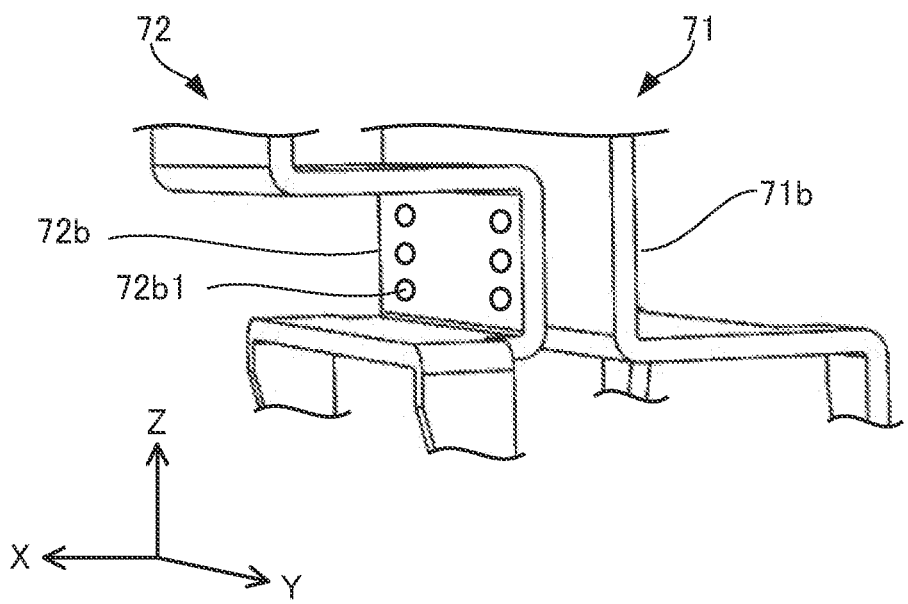
FIGS. 14A and 14B are fragmentary perspective views of first and second wiring members of a wiring unit included in a semiconductor device according to a third embodiment.
Figure 14B:
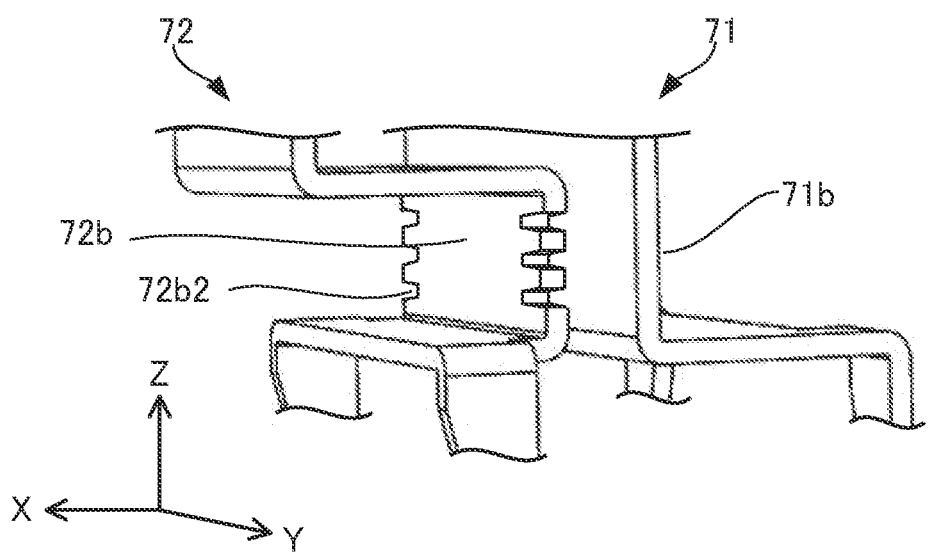

In a third embodiment, a case where openings are formed in at least one of a first vertical portion 71b of a first wiring member 71 and a second vertical portion 72b of a second wiring member 72 included in a wiring unit 70 will be described with reference to FIGS. 14A and 14B. FIGS. 14A and 14B are fragmentary perspective views of first and second wiring members of a wiring unit included in a semiconductor device according to a third embodiment. FIGS. 14A and 14B illustrate different cases.

With the second wiring member 72 illustrated in FIG. 14A, a plurality of through holes 72b1 are made as openings in the second vertical portion 72b of the second wiring member 72 illustrated in FIG. 6. The size, number, or position of the through holes 72b1 is an example. The through holes 72b1 are made in the second vertical portion 72b to a degree that the strength of the second vertical portion 72b does not deteriorate. Furthermore, with the second wiring member 72 illustrated in FIG. 14B, a plurality of notch portions 72b2 are formed as openings in outer edge portions in the width direction of the second vertical portion 72b of the second wiring member 72 illustrated in FIG. 6. The size, number, or position of the notch portions 72b2 is also an example. The notch portions 72b2 are formed in the second vertical portion 72b to a degree that the strength of the second vertical portion 72b does not deteriorate. In addition, the above through holes 72b1 or notch portions 72b2 may be formed not only in the second vertical portion 72b of the second wiring member 72 but also in the first vertical portion 71b of the first wiring member 71. Moreover, the above through holes 72b1 or notch portions 72b2 may be formed only in the first vertical portion 71b of the first wiring member 71.

If the first wiring member 71 and the second wiring member 72 are integrally molded with a wiring holding portion 73, then a material for the wiring holding portion 73 enters into the through holes 72b1 or the notch portions 72b2. This improves adhesion of the wiring holding portion 73 to the first wiring member 71 and the second wiring member 72 and suppresses positional deviation between the wiring holding portion 73 and the first wiring member 71 or the second wiring member 72 and positional deviation between the first wiring member 71 and the second wiring member 72. As a result, stress applied to the wiring holding portion 73 near the first bent portion 71c of the first wiring member 71 and the second bent portion 72c of the second wiring member 72 is relaxed. Accordingly, the occurrence of damage to the wiring holding portion 73 near the first bent portion 71c of the first wiring member 71 and the second bent portion 72c of the second wiring member 72 is suppressed and the insulation of the wiring unit 70 is maintained. As a result, damage to the semiconductor device 10 is prevented and deterioration in the reliability of the semiconductor device 10 is suppressed.

According to the disclosed techniques, the occurrence of damage is suppressed, deterioration in insulation resistance is prevented, damage to a semiconductor device is prevented, and deterioration in the reliability of a semiconductor device is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device, comprising:
  a first semiconductor chip and a second semiconductor chip; and
  a wiring unit including
    a first wiring member having a first one end portion electrically connected to the first semiconductor chip, a second wiring member having a second one end portion electrically connected to the second semiconductor chip, and a wiring holding portion holding a part of the first wiring member and a part of the second wiring member, wherein:

the first wiring member includes
a first horizontal portion parallel to a principal surface of the first semiconductor chip,
a first vertical portion perpendicular to the first horizontal portion, and
a first bent portion bent to connect the first horizontal portion and the first vertical portion;

the second wiring member includes
a second horizontal portion, a surface of which is flush with a surface of the first horizontal portion,
a second vertical portion disposed at a determined distance from the first vertical portion to form a first gap, and having a surface parallel to a surface of the first vertical portion, and
a second bent portion bent in a direction opposite to the first bent portion to connect the second horizontal portion and the second vertical portion, the second bent portion disposed at a determined distance from the first bent portion to form a second gap; and the wiring holding portion is configured to fill the first gap between the first vertical portion and the second vertical portion and the second gap between the first bent portion and the second bent portion.

2. The semiconductor device according to claim 1, wherein the wiring holding portion further fills in
an external angle side of the first bent portion formed by an outer surface of the first horizontal portion facing the first semiconductor chip and an outer surface of the first vertical portion facing the second vertical portion, and
an external angle side of the second bent portion formed by an outer surface of the second horizontal portion facing the second semiconductor chip and an outer surface of the second vertical portion facing the first vertical portion.

3. The semiconductor device according to claim 1, wherein the wiring holding portion fills so as to cover
an outer side of the first vertical portion that is a side opposite to an inner side at which the second vertical portion is disposed; and
an outer side of the second vertical portion that is a side opposite to an inner side at which the first vertical portion is disposed.

4. The semiconductor device according to claim 1, further comprising:
a first conductive plate to which the first semiconductor chip is electrically connected;
a second conductive plate to which the second semiconductor chip is electrically connected; and
a case which houses the first semiconductor chip, the second semiconductor chip, the first wiring member, the second wiring member, and the wiring unit,
wherein:
the first wiring member includes the first one end portion and a first other end portion, the first one end portion being electrically connected to the first conductive plate, the first other end portion extending outside the case; and
the second wiring member includes the second one end portion and a second other end portion, the second one end portion being electrically connected to the second conductive plate, a second other end portion extending outside the case.

5. The semiconductor device according to claim 4, further comprising a sealing member that fills in the case to seal the first semiconductor chip, the second semiconductor chip, the first conductive plate, the second conductive plate, a part of the first wiring member, and a part of the second wiring member, the sealing member having a sealing surface located between surfaces of the first and second horizontal portions and an upper surface of the wiring holding portion in a direction orthogonal to the principal surface of the first semiconductor chip.

6. The semiconductor device according to claim 4, wherein:
the first wiring member further includes a first leg portion that includes the first one end portion connected to the first conductive plate, the first leg portion extending from the first horizontal portion to the first conductive plate; and
the second wiring member further includes a second leg portion having the second one end portion connected to the second conductive plate, the second leg portion extending from the second horizontal portion to the second conductive plate.

7. The semiconductor device according to claim 4, wherein:
the first wiring member includes a first external connection portion that includes the first other end portion extending outside the case, the first external connection portion extending upward with respect to the first semiconductor chip; and
the second wiring member includes a second external connection portion that includes the second other end portion extending outside the case, the second external connection portion extending upward with respect to the second semiconductor chip.

8. The semiconductor device according to claim 1, wherein the second wiring member further includes a connection portion extending from the second vertical portion in a direction away from the first vertical portion.

9. The semiconductor device according to claim 8, wherein the wiring holding portion further includes the connection portion.

10. The semiconductor device according to claim 1, wherein the determined distance forming the first gap between the first vertical portion and the second vertical portion is in a range from 0.25 mm to 4.0 mm.

11. The semiconductor device according to claim 1, wherein:
the second wiring member is a P terminal included in an upper arm; and
the first wiring member is an N terminal included in a lower arm.

12. The semiconductor device according to claim 1, wherein a lower surface of the wiring holding portion that faces the first semiconductor chip and the second semiconductor chip protrudes from the first horizontal portion and the second horizontal portion toward the principal surface of the first semiconductor chip and a principal surface of the second semiconductor chip.

13. The semiconductor device according to claim 1, wherein:
for the first wiring member having a thickness value T1, a curvature of the first bent portion is smaller than 1/T1; and for the second wiring member having a thickness value T2, a curvature of the second bent portion is smaller than 1/T2.

14. The semiconductor device according to claim 1, wherein the first bent portion has a first notch portion at a side where the first gap is formed and the second bent portion has a second notch portion at a side where the second gap is formed.

15. The semiconductor device according to claim 1, wherein a width of the first vertical portion is larger than a width of the second vertical portion in a plan view of the semiconductor device.

16. The semiconductor device according to claim 15, wherein the wiring holding portion encloses a whole of the first vertical portion and encloses in the plan view the second vertical portion except edge portions in a width direction of the second vertical portion.

17. The semiconductor device according to claim 15, wherein an external angle side of the second bent portion formed by an outer surface of the second horizontal portion facing the second semiconductor chip and an outer surface of the second vertical portion facing the first vertical portion has a curved surface along a width direction of the second horizontal portion.

18. The semiconductor device according to claim 1, wherein at least one of the first vertical portion or the second vertical portion includes a plurality of openings.

\* \* \* \* \*